(12) United States Patent
Shindo

(10) Patent No.: US 9,082,798 B2
(45) Date of Patent: Jul. 14, 2015

(54) SUBSTRATE COLLECTING METHOD

(75) Inventor: Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 833 days.

(21) Appl. No.: 13/365,377

(22) Filed: Feb. 3, 2012

(65) Prior Publication Data

US 2012/0130529 A1 May 24, 2012

Related U.S. Application Data

(62) Division of application No. 12/439,833, filed as application No. PCT/JP2007/066088 on Aug. 20, 2007, now Pat. No. 8,135,486.

(30) Foreign Application Priority Data

Sep. 5, 2006 (JP) ................................. 2006-240037

(51) Int. Cl.
| | |
|---|---|
| *G05B 19/04* | (2006.01) |
| *G05B 19/18* | (2006.01) |
| *G06F 19/00* | (2011.01) |
| *G06F 7/00* | (2006.01) |

(Continued)

(52) U.S. Cl.
CPC ................ *H01L 21/67259* (2013.01)

(58) Field of Classification Search
CPC .............. H01L 21/68707; H01L 2224/75753; H01L 2224/81121; G03F 7/70691; G03F 9/7015; Y10S 414/135; Y10S 414/141
USPC .................. 700/95, 114, 213, 245, 250, 255; 156/350, 351; 414/935, 936, 940, 941; 430/22, 30; 438/710, 716, 729
See application file for complete search history.

(56) References Cited

U.S. PATENT DOCUMENTS 6,225,012 B1 * 5/2001 Nishi et al. ...................... 430/22
6,350,698 B1 * 2/2002 Kamide ......................... 438/715
(Continued)

FOREIGN PATENT DOCUMENTS

| JP | 08-008328 A | 1/1996 |
| JP | 09-181154 A | 7/1997 |

(Continued)

OTHER PUBLICATIONS

Chinese Office action for 2007800207912 date Dec. 25, 2009.
(Continued)

*Primary Examiner* — Crystal J Barnes-Bullock
(74) *Attorney, Agent, or Firm* — Pearne & Gordon LLP

(57) ABSTRACT

Even in case that a wafer is so greatly deviated that a peripheral portion of the wafer cannot be detected, position determination of the wafer can be performed without inflicting a damage on the wafer. The wafer peripheral portion, which is a target, is detected based on output images from a plurality of imaging units disposed along a peripheral portion shape of the wafer (step S210), and a wafer position deviation correcting step (step S220) or a rough correcting step (step 230) is performed according to the number of the imaging units capable of detecting the wafer peripheral portion. In case that the wafer peripheral portion cannot be detected by all the imaging units, a wafer position adjusting step (step 240) for moving the wafer is performed in a position adjusting direction acquired by a combination of the output images by each imaging unit.

3 Claims, 24 Drawing Sheets

(51) Int. Cl.
*G03F 9/00* (2006.01)
*G03C 5/00* (2006.01)
*H01L 21/302* (2006.01)
*H01L 21/67* (2006.01)

(56) References Cited

U.S. PATENT DOCUMENTS

| | | | |
|---|---|---|---|
| 6,577,382 B2 * | 6/2003 | Kida et al. | 355/77 |
| 6,606,145 B2 * | 8/2003 | Irie et al. | 355/72 |
| 7,044,182 B2 * | 5/2006 | Haraguchi | 156/351 |
| 7,110,106 B2 * | 9/2006 | Xu et al. | 356/237.5 |

FOREIGN PATENT DOCUMENTS

| | | |
|---|---|---|
| JP | 11-091948 A | 4/1999 |
| JP | 2002-280287 A | 9/2002 |
| JP | 2006-071395 A | 3/2006 |
| WO | 02/23623 A1 | 3/2002 |

OTHER PUBLICATIONS

Korean Office action for 10-2009-7000470 dated Jan. 24, 2011.
Japanese Office action for 2006-240037 dated Sep. 28, 2011.
International Search Report for PCT/JP2007/066088 dated Oct. 2, 2007.

* cited by examiner

| COMBINATION PATTERN OF BLACK/WHITE DETERMINATION | MEASUREMENT VISUAL FIELD 153A | MEASUREMENT VISUAL FIELD 153B | MEASUREMENT VISUAL FIELD 153C | POSITION ADJUSTING DIRECTION (deg) |
|---|---|---|---|---|
| P1 | WHITE | WHITE | WHITE | − 90.00 |
| P2 | BLACK | BLACK | BLACK | −180.00 |
| P3 | BLACK | WHITE | WHITE | − 35.26 |
| P4 | WHITE | WHITE | BLACK | −125.26 |
| P5 | BLACK | BLACK | WHITE | 35.26 |
| P6 | WHITE | BLACK | BLACK | −215.26 |

SUBSTRATE COLLECTING METHOD

This is a divisional application of U.S. patent application Ser. No. 12/439,833 filed on Mar. 4, 2009, which claims the priority from Japanese Patent Application No. 2006-240037 filed on Sep. 5, 2006, the entire disclosure of which are incorporated herein by reference.

TECHNICAL FIELD

The present invention relates to a substrate position determining method and a substrate collecting method.

BACKGROUND ART

Generally, in a manufacturing process of a semiconductor integrated circuit, the integrated circuit is formed on a target substrate, for example, a semiconductor wafer (hereinafter, simply referred to as a "wafer") by repeatedly performing various kinds of processes, such as a film forming process, an etching process, a thermal process, and the like, on the wafer. Further, a preset post process can also be performed on the wafer after the completion of each process. The post process may be, for example, a process for cleaning the wafer (for example, a process for removing deposited substances stuck on the wafer, or the like) and a process for measuring a processing result of each process (for example, a film thickness measuring process, a particle measuring process, or the like).

Such wafer processes are performed by a substrate processing apparatus including a processing chamber configured to perform a preset process such as a plasma process and a measuring process therein. The substrate processing apparatus also includes, for example, a transfer robot having a transfer arm for transferring the wafer, wherein the transfer arm is configured to be rotatable and movable back and forth. The wafer is transferred into the processing chamber by the transfer arm. In general, a mounting table for mounting the wafer thereon is installed in the processing chamber, and the wafer is transferred between the mounting table and the transfer arm.

However, in order to perform a proper process on the wafer transferred onto the mounting table, the wafer needs to be placed on the mounting table accurately without being deviated in horizontal direction. For the purpose, it is required to detect a positional deviation of the wafer first and to perform a positioning of the wafer after correcting it when the positional deviation is detected.

In this regard, the positional deviation of the wafer has been conventionally detected by detecting the entire circumference of the peripheral portion of the wafer while rotating the wafer at least one time. For example, Patent Document 1 discloses a method of detecting a positional deviation of a wafer by detecting the entire circumference of the peripheral portion of the wafer by a CCD linear sensor while rotating the wafer mounted on the mounting table.

Further, for example, Patent Document 2 discloses a method of correcting a position of a wafer on tweezers by a transfer robot which is equipped with a positioning mechanism for the wafer (see, for example, FIGS. 2 and 3 of Patent Document 2). In this case, a positional deviation of the wafer is detected by detecting the entire circumference of the peripheral portion of the wafer by a light-receiving sensor disposed to face a light emitting diode, while rotating the wafer which is picked out by the tweezers and elevated by an elevating mechanism.

Patent Document 1: Japanese Patent Laid-open Application No. H8-8328
Patent Document 2: Japanese Patent Laid-open Application No. H5-343500
Patent Document 3: Japanese Patent Laid-open Application No. H11-91948
Patent Document 4: Japanese Patent Laid-open Application No. 2002-280287

DISCLOSURE OF THE INVENTION

Problems to be Solved by the Invention

However, in the aforementioned methods of detecting the positional deviation by rotating the wafer at least one time, the degree of the positional deviation of the wafer cannot be detected unless the wafer is rotated. Thus, in case that the wafer is deviated greatly, there is a likelihood that the wafer may be damaged, for example, it may be broken, as a result of contacting an inner wall of a processing chamber or components therein when the wafer is rotated.

To resolve this problem, there is known a method of detecting a position of the wafer by detecting a part of the peripheral portion of the wafer without rotating the wafer. For example, Patent Document 3 discloses a method in which a part of the peripheral portion of the wafer is confined by the inner wall of the processing chamber, and it is detected whether the wafer is misaligned or not based on a detection result of the presence or absence of the wafer by a substrate detection sensor which is disposed at a location slightly inward from a position where the periphery end of the wafer is located. Further, Patent Document 4 discloses a method of capturing an image of a peripheral portion of a wafer by a plurality of CCD cameras while holding the peripheral portion of the wafer by a rotary support (loading arm) hung inside the processing chamber, with the peripheral portion of the wafer inserted and detecting a position of the wafer based on the captured images.

However, according to the disclosure of Patent Documents 3 and 4, since the part of the peripheral portion of the wafer is confined by the inner wall or the transfer arm, if the wafer is deviated severely when the wafer is transferred into the processing chamber, the wafer can be damaged as a result of contacting a confining portion. Also, according to the disclosure of Patent Document 4, even if there is no confinement of the peripheral portion of the wafer by the loading arm, if the deviation of the wafer is great to the extent that the images of the peripheral portion of the wafer cannot be captured by any of the CCD cameras, the positional deviation of the wafer can not be corrected since the wafer position can not be detected and the direction for correcting the wafer position cannot also be acknowledged.

Further, in case that the deviation of the wafer is too great to be detected, the wafer may not be loaded onto the transfer arm even when an attempt to withdraw the wafer by the transfer arm is made. Moreover, even if the loading of the wafer onto the transfer arm has succeeded, if the deviation of the wafer on the transfer arm is great, the wafer may be damaged, for example, it may be broken, as a result of contacting the inner wall, the components inside the processing chamber, or a substrate loading/unloading port of the processing chamber, when the wafer is being withdrawn from the processing chamber.

Therefore, according to the prior art, when the deviation of the wafer is great, the wafer is withdrawn by maintenance, for example, by opening a door of the processing chamber manually after stopping the operation of the processing chamber. However, withdrawing the wafer by the maintenance requires an operator's involvement and also causes a reduction of the operating rate of the processing chamber.

The present invention has been conceived in view of the foregoing problems, and the object of the present invention is to provide a substrate position determining method, a substrate position detecting method and a substrate collecting method, capable of performing a positioning and a position detection of a substrate, a withdrawal of the substrate, and so forth without inflicting a damage on the substrate even in case that the substrate is so severely deviated that a detection of its peripheral portion is impossible as well as in case that the detection of the peripheral portion is possible.

Means for Solving the Problems

To solve the problems, in accordance with one aspect of the present invention, there is provided a substrate position determining method for performing a positioning of a substrate in a horizontal direction based on output images from a plurality of imaging units disposed along a peripheral portion shape of the substrate, the method including: a substrate peripheral portion detecting step for detecting a peripheral portion of the substrate, which is a target for a position detection, based on the output image of each imaging unit; a substrate position deviation correcting step for, when the peripheral portion of the substrate can be detected by at least one imaging unit, acquiring a positional deviation from a preset reference position based on a horizontal position of the substrate obtained from a shape of the detected peripheral portion, and correcting the positional deviation by moving the substrate in a horizontal direction if the deviation exceeds a tolerance range; and a substrate position adjusting step for, when the peripheral portion of the substrate cannot be detected by any imaging unit, obtaining a position adjusting direction of the substrate according to a combination of presence/absence states of the substrate detected based on the output image from each imaging unit, and performing an adjustment of a substrate position by moving the substrate along the position adjusting direction.

In accordance with the present invention, though the position of the substrate cannot be detected and thus the degree of the positional deviation cannot be obtained in case that the peripheral portion of the substrate cannot be detected by any imaging unit, the adjustment of the substrate position can be performed by using the fact that a direction of the positional deviation can be estimated by a combination of presence/absence states (for example, brightness states) of the substrate detected based on the output image from each imaging unit. Accordingly, even when the position of the substrate cannot be detected, its position can be adjusted in the direction along which the positional deviation is roughly corrected.

Therefore, in accordance with the present invention, in case that the substrate is severely deviated to the extent that the peripheral portion of the substrate cannot be detected by the imaging units as well as in case that the substrate is deviated to the extent that the peripheral portion of the substrate can be detected by the imaging units, the position of the substrate can be adjusted in the direction along which the positional deviation is roughly corrected. Accordingly, the position determination of the substrate can be carried out without inflicting any damage on the substrate due to a contact of the substrate with, e.g., a sidewall of the processing chamber or components therein.

Further, when the peripheral portion of the substrate becomes detectable by at least one imaging unit through the substrate position adjusting step, the positional deviation from the preset reference position may be acquired based on the horizontal position of the substrate obtained from the shape of the detected peripheral portion, and if the positional deviation exceeds the tolerance range, the positional deviation may be corrected by moving the substrate along a horizontal direction. As described above, by re-detecting the position of the substrate and then correcting the positional deviation, the position of the substrate can be corrected more accurately.

Furthermore, it is desirable that in the substrate position adjusting step, when there is an imaging unit considered to be in a substrate presence state, which is determined based on the output image from each imaging unit, the position adjusting direction is determined to be a direction along which a center of the substrate is distanced away from an installation place of the imaging unit; and when there is an imaging unit considered to be in a substrate absence state, the position adjusting direction is determined to be a direction along which the center of the substrate approaches an installation place of the imaging unit. In this way, a direction along which the positional is roughly corrected can be regard as the position adjusting direction.

Further, in the substrate position adjusting step, when moving the substrate along the position adjusting direction, the substrate may be moved by a preset moving amount over a plurality of times. As a result, it is possible to avoid an excessive movement of the substrate, so that the substrate can get close to the reference position certainly. In this case, in the substrate position adjusting step, when the number of movements of the substrate exceeds a predetermined number while the peripheral portion of the substrate cannot be detected by any imaging unit, the substrate may be withdrawn.

Furthermore, the substrate position deviation correcting step may include the steps of: acquiring, when peripheral portions of the substrate can be detected by all the imaging units, the positional deviation from the preset reference position based on the horizontal position of the substrate obtained from shapes of all the detected peripheral portions, and correcting the positional deviation by moving the substrate along the horizontal direction if the positional deviation exceeds the tolerance range; acquiring, when the peripheral portion(s) of the substrate can be detected by only a part of the imaging units, a rough positional deviation from the present reference position based on a rough horizontal position of the substrate obtained from a shape(s) of the detected peripheral portion(s), and moving the substrate to correct the positional deviation; and acquiring, when peripheral portions of the substrate become detectable by all the imaging units through correcting the rough positional deviation, a positional deviation from the preset reference position after re-detecting the horizontal position of the substrate based on shapes of all the detected peripheral portions, and correcting the positional deviation by moving the substrate along the horizontal direction if the positional deviation exceeds the tolerance range.

In accordance with the present invention, when the position of the substrate (for example, the center of the substrate) has to be obtained based on the peripheral portions of the substrate detected by the imaging units, though a case of detecting the peripheral portion of the substrate only by a part of imaging units has a lower accuracy than a case of detecting the peripheral portion of the substrate by all imaging units, the position of the substrate is detectable. For this reason, even when the peripheral portions of the substrate can be detected only by a part of the imaging units, a positional deviation may be corrected based on a rough position of the substrate obtained from a shape of the detected peripheral portion.

In this way, the substrate is moved to the position where the peripheral portion of the substrate can be detected by all imaging units and then the positional deviation is re-detected and corrected. Therefore, in case that the peripheral portion of the substrate can be detected only by a part of imaging units as well as in case that the peripheral portion of the substrate can be detected by all imaging units, the positional deviation of the substrate can be corrected accurately.

Further, a plurality of illuminating light sources are arranged such that each light source irradiates light toward each imaging unit, and a presence/absence state of the substrate and the peripheral portion thereof in the output image of each imaging unit is detected by using the fact that if the substrate is present between the imaging unit and the illuminating light source, the output image of the imaging unit becomes dark, and if the substrate is not present between the imaging unit and the illuminating light source, the output image of the imaging unit becomes bright. In this case, for example, a multiplicity of detection regions is set on a measurement visual field of each imaging unit, and the presence/absence state of the substrate and the peripheral portion thereof is determined based on a brightness state of each detection region. As a result, the presence/absence state of the substrate and the peripheral portion thereof can be determined by a simple algorithm.

To solve the problems, in accordance with another aspect of the present invention, there is provided a substrate position detecting method for performing a detection of a horizontal position of a substrate based on output images from a plurality of imaging units disposed along a peripheral portion shape of the substrate, the method including: a substrate peripheral portion detecting step for detecting a peripheral portion of the substrate, which is a target for a position detection, based on the output image of each imaging unit; a substrate position detecting step for, when it is determined that the peripheral portion of the substrate can be detected by at least one imaging unit, detecting the horizontal position of the substrate based on a shape of the detected peripheral portion; and a substrate position adjusting step for, when it is determined that the peripheral portion of the substrate cannot be detected by any imaging unit, acquiring a position adjusting direction of the substrate according to a combination of presence/absence states of the substrate obtained based on the output image from each imaging unit, and performing an adjustment of a substrate position by moving the substrate along the position adjusting direction.

In accordance with the present invention, in case that the substrate is severely deviated to the extent that the peripheral portion of the substrate cannot be detected by the imaging units as well as in case that the substrate is deviated to the extent that the peripheral portion of the substrate can be detected by the imaging units, the position of the substrate can be adjusted in the direction along which the positional deviation is roughly corrected. Therefore, the position detection of the substrate can be carried out without inflicting any damage on the substrate due to a contact of the substrate with, e.g., a sidewall of the processing chamber or components therein.

Furthermore, the substrate position detecting step may include the steps of: detecting, when peripheral portions of the substrate can be detected by all the imaging units, the horizontal position of the substrate based on shapes of all the detected peripheral portions; acquiring, when a peripheral portion(s) of the substrate can be detected by only a part of the imaging units, a rough positional deviation from the present reference position based on a rough horizontal position of the substrate obtained from a shape(s) of the detected peripheral portion(s), and moving the substrate to correct the positional deviation; and re-detecting, when peripheral portions of the substrate become detectable by all the imaging units through correcting the rough positional deviation, the horizontal position of the substrate based on shapes of all the detected peripheral portion. In this way, in case that the peripheral portion of the substrate can be detected only by a part of imaging units as well as in case that the peripheral portion of the substrate can be detected by all imaging units, the positional deviation of the substrate can be corrected accurately.

To solve the problems, in accordance with still another aspect of the present invention, there is provided a substrate collecting method for withdrawing a substrate by a transfer arm, the method including: a substrate peripheral portion detecting step for detecting a peripheral portion of the substrate, which is a target to be withdrawn, based on output images from a plurality of imaging units disposed along a peripheral portion shape of the substrate; a substrate position deviation correcting step for, when the peripheral portion of the substrate can be detected by at least one imaging unit, acquiring a positional deviation from a preset reference position based on a horizontal position of the substrate obtained from a shape of the detected peripheral portion, and correcting the positional deviation by moving the substrate in a horizontal direction if the deviation exceeds a withdrawable range; and a substrate collecting step for withdrawing the substrate by the transfer arm when the deviation does not exceed the withdrawable range, or when the deviation is reduced not to exceed the withdrawable range through the substrate position deviation correcting step.

In accordance with the present invention, if the peripheral portion of the substrate can be detected by at least one imaging unit, the positional deviation of the substrate can be corrected so that the substrate can be moved to the position where the substrate can be withdrawn by the transfer arm. Therefore, the substrate can be withdrawn by the transfer arm without inflicting any damage on the substrate as a result of a contact of the substrate with, e.g., a sidewall of the processing chamber or components therein.

Further, the method may further include: a substrate position adjusting step for, when the peripheral portion of the substrate cannot be detected by any imaging unit, obtaining a position adjusting direction of the substrate according to a combination of presence/absence states of the substrate detected based on the output image from each imaging unit, and performing an adjustment of a substrate position by moving the substrate along the position adjusting direction. In this way, even in case that the substrate is severely deviated to the extent that the peripheral portion of the substrate cannot be detected by the imaging units, the position of the substrate can be adjusted in the direction along which the positional deviation is roughly corrected and thus the substrate can be moved to the position where the substrate can be withdrawn by the transfer arm. Therefore, the substrate can be withdrawn by the transfer arm without inflicting any damage on the substrate even in case that the withdrawal by maintenance has been needed in the prior art.

Furthermore, when the peripheral portion of the substrate becomes detectable by at least one imaging unit through the substrate position adjusting step, the positional deviation from the preset reference position may be acquired based on the horizontal position of the substrate obtained from the shape of the detected peripheral portion, and, if the positional deviation exceeds the withdrawable range, the positional deviation may be corrected by moving the substrate along a horizontal direction. If the positional deviation does not exceed the withdrawable range or if the position deviation may be reduced not to exceed the withdrawable range through the substrate position deviation correcting step, the substrate may be withdrawn by the transfer arm. In this way, the position of the substrate can be corrected more accurately by re-detecting the position of the substrate and then correcting the positional deviation.

To solve the problems, in accordance with still another aspect of the present invention, there is provided a substrate position determining method for performing a positioning of a substrate in a horizontal direction by using a substrate transfer device for transferring the substrate between a transfer arm and a mounting table and a plurality of imaging units disposed along a peripheral portion shape of the substrate, the method including: receiving the substrate from the transfer arm by lifting a plurality of vertically and horizontally movable supporting pins of the substrate transfer device, the supporting pins supporting a bottom surface of the substrate; detecting a peripheral portion of the substrate received from the transfer arm, based on an output image from each imaging unit; acquiring, when the peripheral portion of the substrate can be detected by at least one imaging unit, a positional deviation from a preset reference position based on a horizontal position of the substrate obtained from a shape of the detected peripheral portion, and correcting the positional deviation of the substrate by moving the supporting pins in a horizontal direction if the deviation exceeds a tolerance range; and obtaining, when the peripheral portion of the substrate cannot be detected by any imaging unit, a position adjusting direction of the substrate according to a combination of presence/absence states of the substrate detected based on the output image from each imaging unit, and performing an adjustment of a substrate position by moving the supporting pins along the position adjusting direction, with the substrate supported, until the peripheral portion of the substrate can be detected by at least one imaging unit.

Further, in the step of receiving the substrate from the transfer arm, the substrate may be received by lowering the transfer arm in a state that the supporting pins are raised. In this way, the substrate can be received, with the supporting pins lifted up.

In accordance with the present invention, positioning of the substrate can be performed by the substrate transfer device while the substrate is lifted up by the supporting pins, and thereby positioning of the substrate can be performed in short time. Further, the transfer arm performs another process after transferring the substrate to the substrate transfer device, and thus a throughput of the substrate process can be improved.

Effect of the Invention

In accordance with the present invention, even in case that the substrate is so greatly deviated that the peripheral portion of the substrate cannot be detected, position detection, positioning and withdrawal of the substrate can be performed without inflicting a damage on the substrate.

EXPLANATION OF CODES

Figure 1:
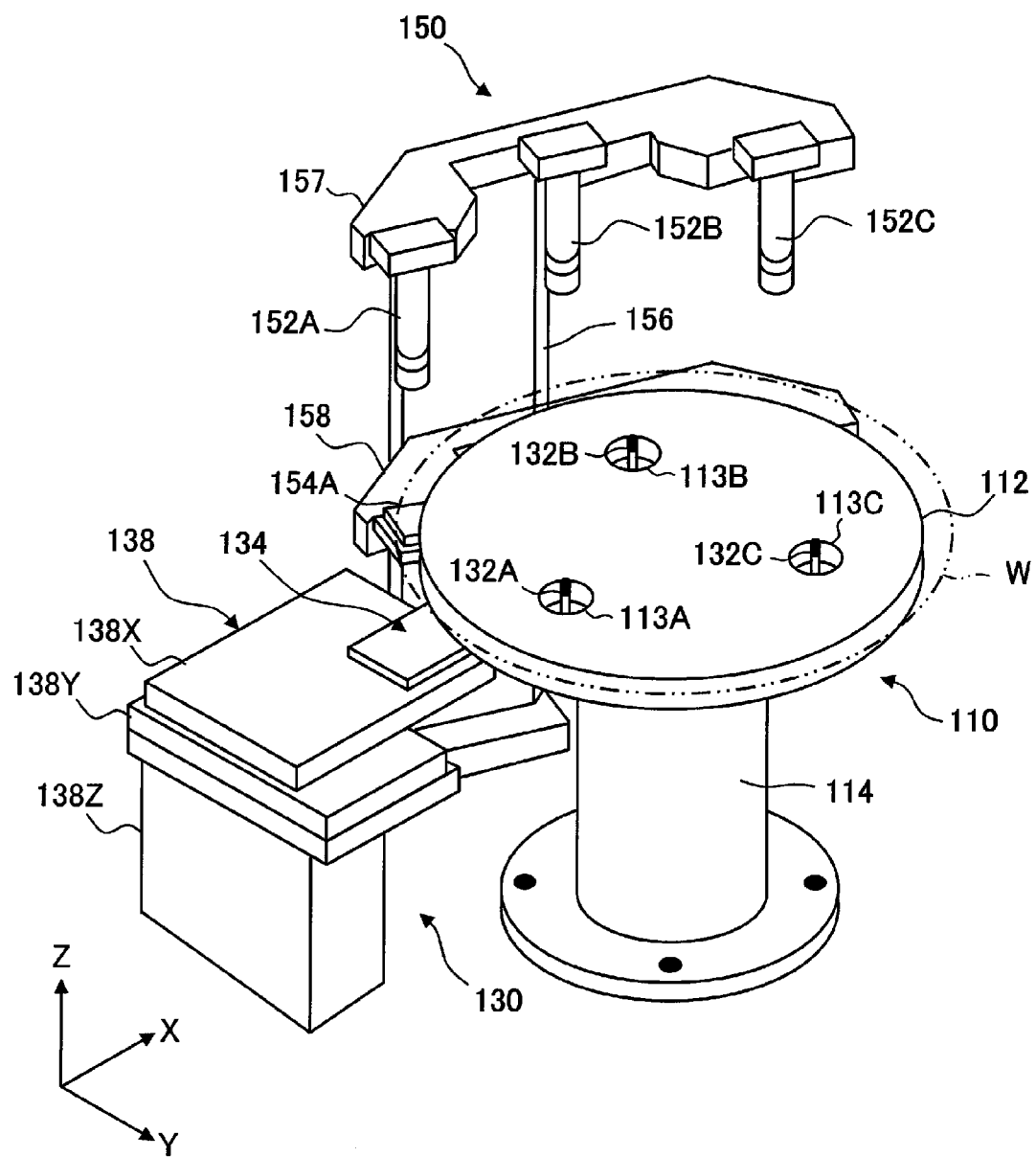
FIG. 1 provides a perspective view describing a configuration of a substrate transfer device, a substrate position detecting device, and a mounting table unit in accordance with an embodiment of the present invention.

110: mounting table unit
112, 115: mounting table
113A~113C: through holes
114: supporting shaft
130: substrate transfer device
132A~132C: supporting pins
134: base
135: mounting plate
136: supporting plate
138: supporting pin driving mechanism
138X: X-directional driving unit
138Y: Y direction driving unit
138Z: Z-directional driving unit
150: substrate position detecting device
152A~152C: imaging units
152A~153C: measurement visual fields
153a~153e: measurement region
154A~154C: illuminating light source
156: install stand
157, 158: bracket
200: control unit
W: wafer

BEST MODE FOR CARRYING OUT THE INVENTION

Hereinafter, embodiments of the present invention will be described in detail with reference to the accompanying drawings. Through the whole document, like parts having substantially same configurations and functions will be assigned like reference numerals, and redundant description thereof will be omitted.

(Example of Device Configurations)

Figure 2:
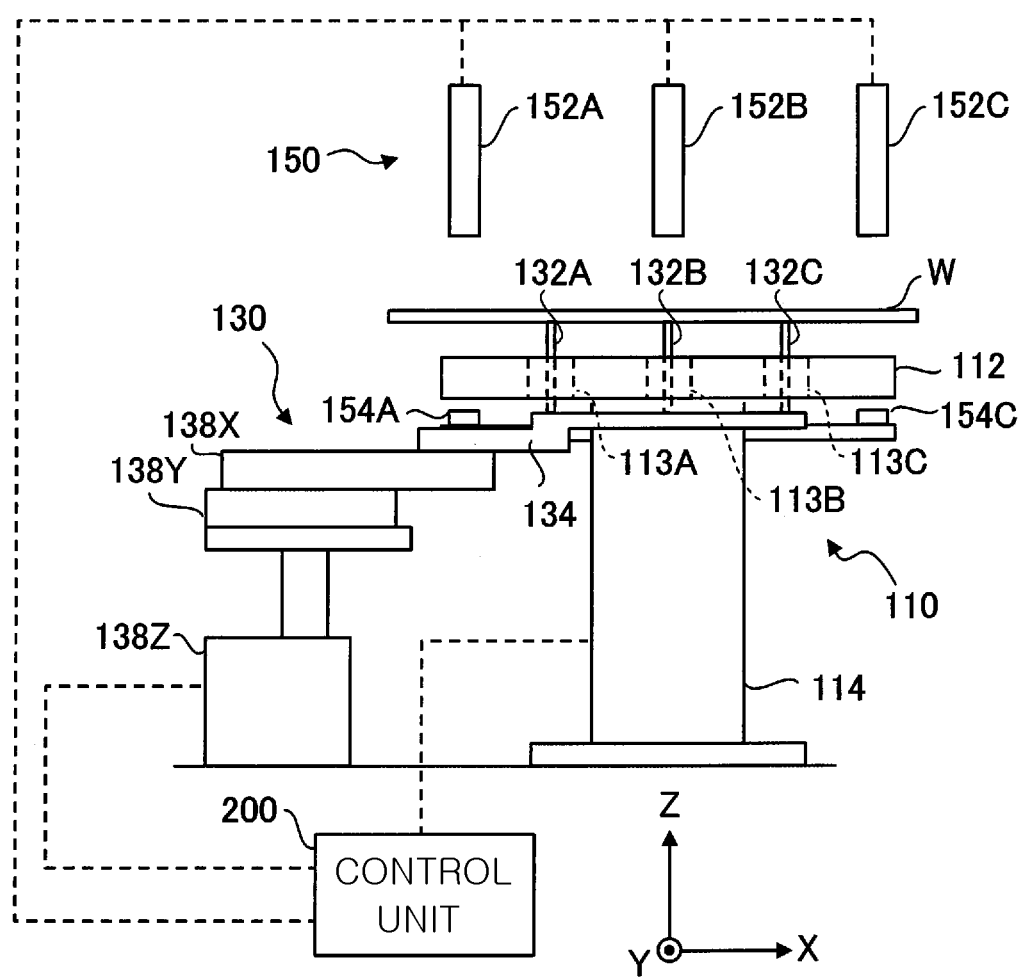
FIG. 2 is a diagram illustrating lateral sides of each device shown in FIG. 1.

First, an embodiment of devices capable of performing a method of the present invention will be described with reference to the accompanying drawings. FIG. 1 is a perspective view illustrating an installation example of each device, and FIG. 2 provides a side view of each device shown in FIG. 1. The present embodiment will be described for the case of performing a correction of a deviation of a substrate, e.g., a semiconductor wafer W mounted on a mounting table by using a substrate transfer device 130 which serves to transfer the wafer W between a transfer arm (not shown) and a mounting table 112. Thus, the substrate transfer device 130 in the present embodiment also functions as a substrate position deviation correcting mechanism.

As illustrated in FIGS. 1 and 2, disposed in the vicinity of a mounting table unit 110 including the mounting table 112 for mounting the wafer W thereon are the substrate transfer device (lifter unit) 130 capable of adjusting a position of the wafer W in horizontal direction; and a substrate position detecting device 150 for detecting a horizontal position of the wafer W.

The mounting table 112 is formed in a circular plate shape having a smaller diameter than that of the wafer W, as illustrated in FIG. 2, for example. The wafer W is mounted on a mounting surface on the top side of the mounting table 112. The mounting table 112 is installed on, for example, a bottom surface inside a processing chamber via a supporting shaft 114 by using fastening members such as bolts. Further, the mounting table 112 may be configured to be rotatable. In the configuration in which the mounting table 112 is rotatable, a stepping motor, for example may be installed in the inside of, for instance, the supporting shaft 114, so that the mounting table 112 can be rotated by the stepping motor. Further, on the mounting table 112, the wafer W on the mounting surface may be attracted and held by, for example, a vacuum chuck function, whereby the wafer W can be prevented from falling off the mounting table 112 even when the mounting table 112 is rotated at a high speed. The mounting table unit 110 is connected to a control unit 200 as illustrated in FIG. 2, and the rotation of the mounting table 112 is controlled based on a control signal from the control unit 200.

(Substrate Position Deviation Correcting Mechanism)

Figure 3:
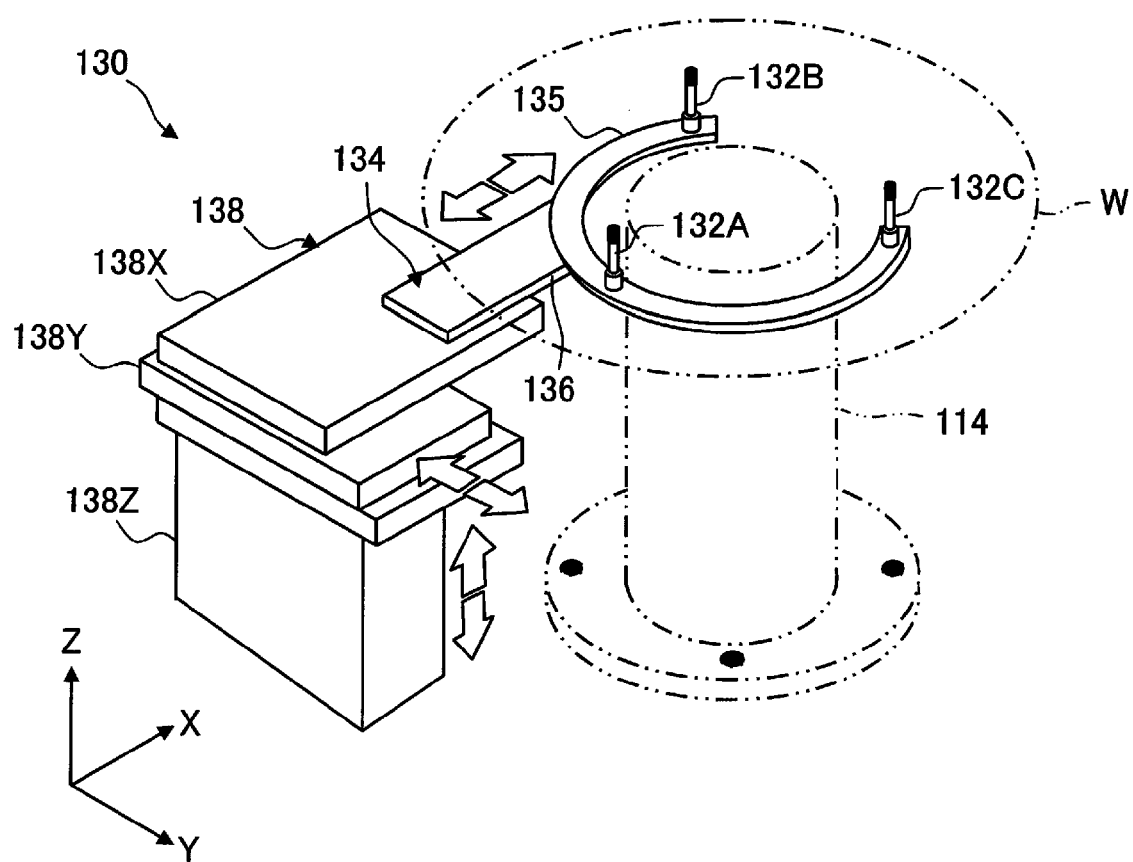
FIG. 3 is a perspective view illustrating the configuration of the substrate transfer device shown in FIG. 1.

Here, the configuration of the substrate transfer device 130 serving as the substrate position deviation correction mechanism will be described with reference to FIGS. 1 and 3 in detail. FIG. 3 only shows the substrate transfer device 130 taken from FIG. 1. Further, in order to facilitate the understanding of the configuration of the substrate transfer device, illustration of the mounting table 112 is omitted and only the supporting shaft 114 is illustrated by a double-dotted dashed line.

As shown in FIG. 3, the substrate transfer device 130 is provided with a plurality of supporting pins (lifter pins) 132A to 132C (for example, three) for supporting the wafer W when the wafer W is transferred between the transfer arm (not shown) and the mounting table 112. These supporting pins 132A to 132C are arranged around the supporting shaft 114 of the mounting table 112 so as to be distanced apart from each other. For example, to support the wafer W stably, it is desirable to arrange the supporting pins 132A to 132C around the supporting shaft 114 at the same interval. In addition, though the number of the supporting pins 132A to 132C need not be limited to three, it is desirable to have at least three to stably support the wafer W.

The supporting pins 132A to 132C are uprightly mounted on a base (lifter base) 134, and all the supporting pins 132A to 132C can be moved in vertical or horizontal direction via the base 134 at the same time. The base 134 includes, for example, a mounting plate 135 substantially formed in a ring shape and a supporting plate 136 supporting the mounting plate 135, as illustrated in FIG. 3. The supporting pins 132A to 132C are mounted on the top portion of the mounting plate 135 along the ring shape at a preset interval (for example, at the same interval), and the supporting plate 136 is mounted to a stage constituting an X-directional driving unit 138X of a supporting pin driving mechanism 138 which will be described later.

Furthermore, an opening portion is provided in a part of the ring shape of the mounting plate 135 so that the mounting plate 135 can interpose the supporting shaft 114 from the lateral side of the supporting shaft 114. In this configuration, by interposing the supporting shaft 114 in the mounting plate 135 from the opening portion, the substrate transfer device 130 can be installed so that the supporting pins 132A to 132C are arranged around the supporting shaft 114 even after the supporting shaft 114 has been fixed to the bottom surface of the processing chamber.

The base 134 is mounted to the supporting pin driving mechanism 138 capable of driving the supporting pins 132A to 132C in horizontal direction as well as in vertical direction. Specifically, the supporting pin driving mechanism 138 includes, for example, the X-directional driving unit 138X and a Y-directional driving unit 138Y capable of driving the supporting pins 132A to 132C in the X direction and in the Y direction, respectively, via the base 134. The X-directional driving unit 138X may be implemented by, e.g., a stage which can be linearly driven in the X direction, and the Y-directional driving unit 138Y may be implemented by, e.g., a stage which can linearly drive the X-directional driving unit in the Y direction perpendicular to the X direction. Further, the X-directional driving unit 138X and the Y-directional driving unit 138Y constitute a horizontal (XY-directional) driving unit together.

Moreover, the supporting pin driving mechanism 138 includes a Z-directional driving unit 138Z serving as a vertical driving mechanism capable of driving the supporting pins 132A to 132C in Z direction (vertical direction) via the base 134. The Z-directional driving unit 138Z may be implemented by, for example, a linearly-drivable stage capable of vertically driving the X-directional driving unit 138X and the Y-directional driving unit 138Y.

As an actuator for each of the driving units 138X, 138Y and 138Z, a linear actuator, for example, is desirable. By using the linear actuator, a repetitive positioning accuracy of several micrometers ($\mu$m) or below can be obtained, and each stage can be driven at a high speed. Further, besides using the linear actuator, each stage can be driven by, for example, a combination mechanism of a ball screw and a stepping motor. Furthermore, the substrate transfer device 130 is connected with the control unit 200 as illustrated in FIG. 2, and driving of each of the driving units 138X, 138Y and 138Z is controlled based on a control signal from the control unit 200.

With the above-described supporting pin driving mechanism 138, by vertically driving the supporting pins 132A to 132C via the base 134 by means of the Z-directional driving unit, the wafer W can be moved up and down with respect to the transfer arm or the mounting table 112. Further, by driving the supporting pins 132A to 132C in the horizontal direction (XY direction) via the base 134 by means of the X-directional driving unit 138X and the Y-directional driving unit 138Y, horizontal positions of the supporting pins 132A to 132C can be adjusted while the wafer W is loaded on them.

After the wafer W is transferred from the transfer arm onto the supporting pins 132A to 132C as described, a positional deviation of the wafer W can be corrected just by moving the supporting pins 132A to 132C, on which the wafer W is loaded, in the horizontal direction, so that a throughput of a wafer processing can be improved.

Meanwhile, in case that the transfer of the wafer W is performed with respect to the mounting table 112 having a comparatively large diameter as illustrated in FIG. 1, each of the supporting pins 132A to 132C is disposed inside of the mounting table 112. Further, it is configured that leading ends of the supporting pins 132A to 132C are protrusible from and retractable into the mounting surface of the mounting table 112 while passing through holes formed in the mounting table 112. For example, as illustrated in FIG. 1, provided in the mounting table 112 are the through holes 113A to 113C for allowing the supporting pins 132A to 132C to pass therethrough, respectively.

With this configuration, by vertically driving the supporting pins 132A to 132C by means of the Z-directional driving unit 138Z, the leading ends of the supporting pins 132A to 132C can be moved up and down such that they are protruded from or retracted into the through holes 113A to 113C. Further, by horizontally driving (XY-driving) the supporting pins 132A to 132C by means of the X-directional driving unit 138X and the Y-directional driving unit 138Y, the leading ends of the supporting pins 132A to 132C can be horizontally moved (XY-moved) inside the through holes 113A to 113C while they are kept protruded from the mounting surface of the mounting table 112 through the inside of the through holes 113A to 113C.

In such configuration, since it is possible to support points near the center of the wafer W by the supporting pins 132A to 132C, the wafer W can be supported at points distanced as far away from a target portion to be processed as possible when, for example, a process (e.g., a cleaning process to be described later) is performed on an end portion of the wafer W on the mounting table 112.

In addition, it is desirable to set an opening diameter of each of the through holes 113A to 113C depending on, for example, the diameter of the supporting pins 132A to 132C and their moving amount in the horizontal direction (for example, a range within which positioning in the horizontal direction can be carried out). Each of the through holes 113A to 113C is formed to have a diameter of, for example, about 10 to 20 mm.

Moreover, in case that the mounting table 112 is configured to be rotatable, when the mounting table 112 is rotated, a collision of the supporting pins 132A to 132C with the through holes 113A to 113C can be prevented by lowering the leading ends of the supporting pins 132A to 132C to be located below the bottom surface of the mounting table 112.

Further, though the present embodiment has been described for the case of inserting one supporting pin into each through hole of the mounting table, the present invention is it not limited to this configuration. In case that the number of the supporting pins is great, a plurality of supporting pins may be inserted into each of a multiplicity of through holes in the mounting table.

In the substrate transfer device 130 in accordance with the present embodiment as described above, by configuring the supporting pins 132A to 132C to be movable in the horizontal direction (XY direction), the wafer W sustained on the supporting pins 132A to 132C can be moved in the horizontal direction without using the transfer arm TA, after the wafer W is transferred from the transfer arm TA onto the supporting pins 132A to 132C. Accordingly, the deviation of the wafer W can be corrected promptly. Furthermore, the transfer arm TA can perform another operation (for example, another wafer transferring operation) immediately after it has transferred the wafer W onto the supporting pins 132A to 132C. Thus, the throughput of the wafer processing can be improved.

Furthermore, since the substrate transfer device 130 in accordance with the present embodiment is configured separately from the mounting unit 110, its configuration can be simplified. Moreover, since freedom in the installation within the processing chamber is improved, it can be applied to various processing chambers. Further, in case that the mounting table 112 is rotatable, it is possible to rotate the mounting table 112 at a high speed by separating the mounting unit 110 from the substrate transfer device 130. Additionally, with regard to the substrate transfer device 130, since there can be adopted a configuration in which the supporting pins 132A to 132C are driven in the horizontal direction by the X-directional driving unit 138X and the Y-directional driving unit 138Y, the correction of the position of the wafer W can be carried out with high precision.

In addition, the substrate transfer device 130 in accordance with the present invention corrects the positional deviation not by driving the mounting table in the horizontal direction but by driving the supporting pins 132A to 132C in the horizontal direction. Therefore, in case that the deviation of the wafer W is too great to be detected by the substrate position detecting device 150, the wafer W can be moved in the horizontal direction by the supporting pins 132A to 132C until it reaches a position where it can be detected by the substrate position detecting device 150 while lifting the wafer W with the supporting pins 132A to 132C. Therefore, even in case that the wafer W is greatly deviated, the position of the wafer W can be detected so that the positional deviation thereof can be corrected promptly.

(Substrate Position Detecting Device)

Figure 4:
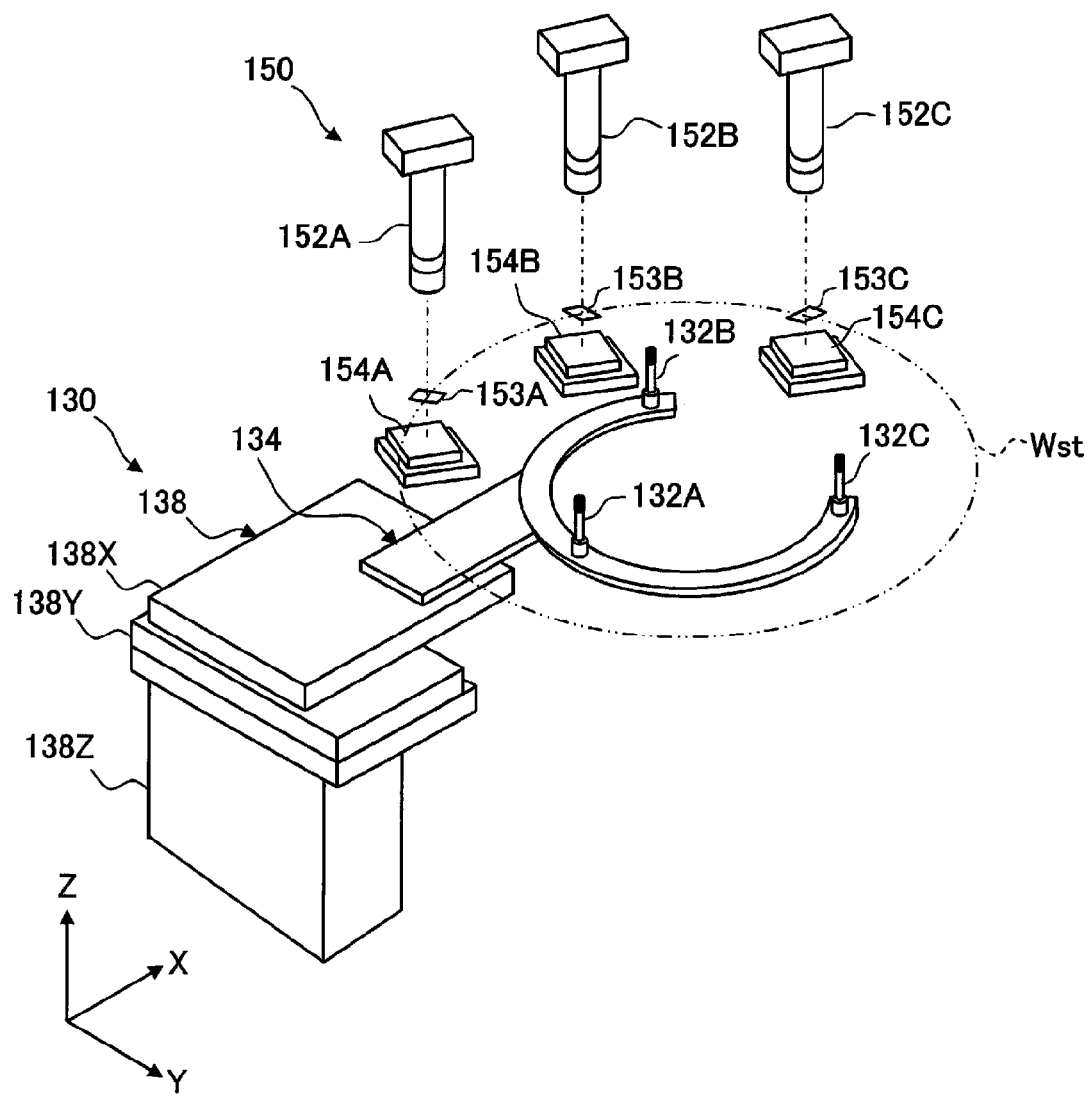
FIG. 4 is a perspective view illustrating the configuration of the substrate position detecting device shown in FIG. 1.

Hereinafter, the substrate position detecting device 150 will be described in detail with reference to FIGS. 1 and 4. FIG. 4 is a perspective view illustrating a configuration of the substrate position detecting device. In FIG. 4, illustration of an install stand 156 and the mounting unit 110 illustrated in FIG. 1 are omitted in order to facilitate description of the substrate position detecting device.

The substrate position detecting device 150 includes a substrate position detecting unit for detecting a horizontal position of the wafer W. As illustrated in FIG. 4, the substrate position detecting unit includes, for example, a plurality of imaging units 152A to 152C (for example, three) for detecting the peripheral portion of the wafer W and illuminating light sources 154A to 154C arranged to face the imaging units 152A to 152C, respectively.

The imaging units 152A to 152C detect a shape and a presence or absence of the peripheral portion of the wafer W and a presence or absence of the wafer W based on an image output obtained by capturing an image of the peripheral portion of the wafer W. The shape of the peripheral portion of the wafer W is used to detect the position of the wafer W, by, for example, calculating the center of the wafer W based on the shape of the peripheral portion thereof. Further, the presence or absence of the peripheral portion of the wafer W is used, for example, to determine whether the detection of the peripheral portion of the wafer W is possible or not. Furthermore, the presence or absence of the wafer W is used, for example, to adjust the positional deviation of the wafer W until the wafer W reaches a position where its peripheral portion can be detected.

In the present embodiment, the imaging units 152A to 152C are, for example, CCD cameras (imaging devices) having, for example, a CCD (Charge Coupled Device) imaging sensor, a focusing lens, and the like. Further, the illuminating light sources 154A to 154C are, for example, LED units. Furthermore, the illuminating light sources 154A to 154C have diffusion plates on their light emitting surfaces, whereby the intensity of the light can be uniformed across the entire light emitting surfaces.

The imaging units 152A to 152C and the illuminating light sources 154A to 154C constituting the substrate position detecting unit are mounted to, for example, the install stand 156 which is uprightly installed as illustrated in FIG. 1. The install stand 156 has a bracket 157 horizontally extended from the upper portion thereof and a bracket 158 horizontally extended below the bracket 157 in parallel thereto. The imaging units 152A to 152C are mounted to the upper bracket 157, while the illuminating light sources 154A to 154C are mounted to the lower bracket 158. Accordingly, the imaging units 152A to 152C and the illuminating light sources 154A to 154C are arranged to be located above and below the wafer W so that the peripheral portion of the wafer W is interposed between them.

As illustrated in the FIG. 4, an optical axis of each of the illuminating light sources 154A to 154C is adjusted to face a light receiving surface of each corresponding one of the imaging units 152A to 152C. Assuming that a wafer height where the wafer W is transferred from the transfer arm onto the supporting pins 132A to 132C raised above the mounting surface of the mounting table 112 is defined as a reception height and a wafer position (wafer position illustrated by a double-dotted dashed line of FIG. 4) where the center of the wafer W and the center of the mounting table 112 are coincident with each other is defined as a reference position Wst in the horizontal direction, the respective imaging units 152A to 152C are adjusted to be focused on the peripheral portion of the wafer W in the reference position Wst at the reception height. Further, they are also adjusted so that portions where the peripheral portion of the wafer W in the reference position Wst can be detected come within measurement visual fields of respective imaging units 152A to 152C.

Figures 5, 6:
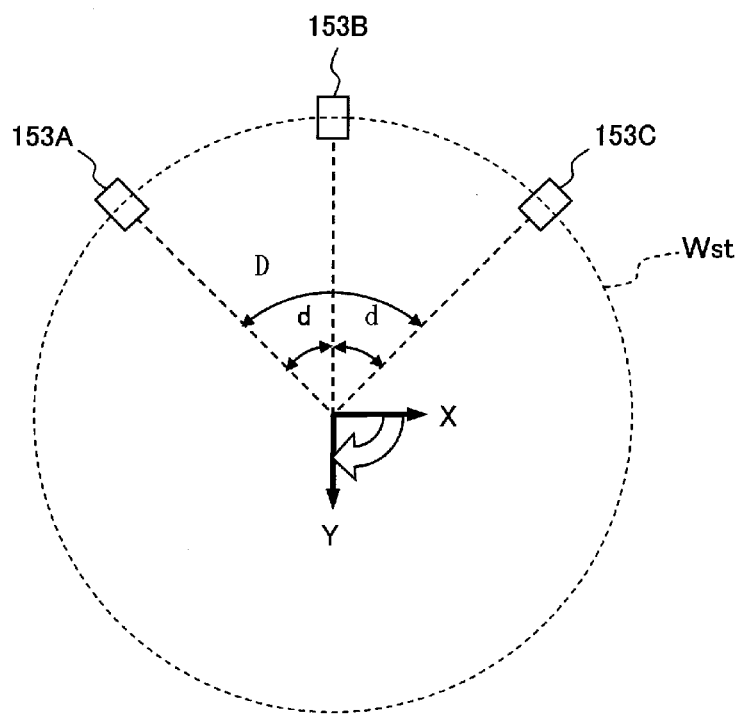
FIG. 5 is a diagram for describing a measurement visual field of each imaging unit in accordance with the same embodiment.
FIG. 6 is a table showing combination patterns of black/white determinations of measurement visual fields and wafer position adjusting directions.

Specifically, as illustrated in FIG. 5, the measurement visual fields 153A to 153C of the respective imaging units 152A to 152C are equi-spaced along the peripheral portion of the wafer W in the reference position Wst. For example, when considering an angle viewed from the center of the wafer W in the reference position Wst, an angle between the measurement visual fields 153A and 153B and an angle between the measurement visual fields 153B and 153C are each defined as d, and an angle between the measurement visual fields 153A and 153C is defined as D. Here, d is set to be about 45 degrees and D is set to be about 90 degrees. Such angles of the measurement visual fields 153A to 153C are not limited to the above mentioned examples, but can be changed freely by adjusting the mounting position of each of the imaging units 152A to 152C. Additionally, such angles are defined by regarding an X axis as 0 degree and a clockwise direction as a positive direction on XY coordinates illustrated in FIG. 5.

Each of the imaging units 152A to 152C is connected to the control unit 200 as illustrated in FIG. 2, and output image data of measurement visual field captured by the imaging units 152A to 152C are transmitted to the control unit 200 which controls each component of the substrate transfer device 130 and the like. The control unit 200 detects the peripheral portion of the wafer W based on the output image data of the measurement visual field 153A to 153C.

For example, if the peripheral portion of the wafer W comes within the measurement visual field 153A, a portion, within the measurement visual field 153A, on which the wafer exists is darkened because light from the illuminating light source 154A is blocked, while the rest portion becomes bright. Thus, the presence or absence of the peripheral portion of the wafer W within the measurement visual field 153 can be detected simply. Here, this state is regarded as a peripheral portion presence state (grey state), and is distinguished from a state in which the entire region of the measurement visual field is all bright (white state) and a state in which the entire region of the measurement visual field is all dark (black state).

Furthermore, in the above-described example, since the boundary between the bright region and the dark region on the measurement visual field 153A represents the shape (for example, a circular arc shape in case that the wafer has a circular plate shape as in the present embodiment) of the peripheral portion of the wafer W, it is possible to detect the shape of the peripheral portion of the wafer W from the output image of the measurement visual field 153A.

Based on the detected shape of the peripheral portion of the wafer W, the control unit 200 calculates the center position of the wafer. Then, the control unit 200 calculates an amount and a direction of deviation of wafer W from the center of the mounting table 112 (or the center of rotation when the mounting table 112 is configured to be rotatable) in the horizontal direction. By driving the supporting pins 132A to 132C in the horizontal direction by means of driving the X-directional driving unit 138X and the Y-directional driving unit 138Y according to the amount and the direction of the deviation, the horizontal position of the wafer W can be adjusted.

Further, besides the above-described method, the horizontal deviation of the wafer W can also be determined by comparing the output image data of the measurement visual fields 153A to 153C, which have been obtained to detect the position of the wafer, with previously stored reference image data, wherein the reference image data are output image data of the measurement visual fields 153A to 153C obtained when the wafer W is in the reference position Wst. For example, assume that the wafer W is deviated from the reference position Wst and the peripheral portion of the wafer W in the output image data of the measurement visual field 153A is deviated. At this time, a ratio (brightness ratio) between the bright region and the dark region of the output image data of the measurement visual field 153A when the wafer W is deviated from the reference position Wst is different from a brightness ratio when the wafer W is in the reference position Wst. Therefore, by comparing the brightness ratio of the target wafer W with the brightness ratio of the wafer in the reference position Wst, the deviation of the wafer W can be detected, and the amount and the direction of the deviation can be calculated according to the brightness ratio.

In such case, the horizontal position of the wafer W can be adjusted by driving the supporting pins 132A to 132C in horizontal direction according to the amount and the direction of the deviation so that the brightness ratio of the measurement visual field 153A becomes equal to that in case the wafer is placed in the reference position Wst.

Further, as another example for detecting the horizontal deviation of the wafer W besides the above-described examples, the presence or absence of the positional deviation of the wafer W can also be determined by comparing an actually detected pattern of the shape of the peripheral portion of the wafer W with a pattern (reference pattern) of the shape of the peripheral portion of the wafer W when the wafer W is not deviated, and the direction and the amount of the deviation can be calculated based on a difference between the pattern of the shape of the peripheral portion of the wafer W and the reference pattern, wherein the reference pattern is stored in a storage unit in advance.

However, when receiving the wafer by raising the supporting pins as in the case of the substrate transfer device 130 in accordance with the present embodiment, the deviation of the wafer W tends to be greater than that in case of receiving the wafer by a transfer member such as a transfer arm which holds up and lifts up the end portion of the wafer W from above, i.e., which confines a position of the wafer W on the arm.

For example, the wafer may be greatly deviated to the extent that its peripheral portion does not exist within the output image data of any of the measurement visual fields 153A to 153C. To elaborate, depending on the measurement visual field, the entire field may become the bright region (in this case, the measurement visual field is determined to be in a white (or bright) state) or the entire field may become the dark region (in this case, the measurement visual field is determined to be in a black (or dark) state). In such cases, the peripheral portion of the wafer W cannot be detected. Therefore, since the degree of the positional deviation cannot be determined by the aforementioned method, the deviation of wafer cannot be corrected.

Hereinafter, a relationship between the black/white determination of the measurement visual field and the wafer position will be described. For example, when a certain measurement visual field is determined to be in a white state (when the entire measurement visual field is bright), the wafer does not exist within the measurement visual field. At this time, if the wafer is present on the supporting pins 132A to 132C, it is highly likely that the wafer W is severely deviated from the measurement visual field towards a center (reference center) of a wafer in the reference position Wst. Meanwhile, when a certain measurement visual field is determined to be in a black state (when the entire measurement visual field is dark), it is highly likely that the wafer W is severely deviated from the wafer center in the reference position Wst toward the measurement visual field, though the wafer W exists within that measurement field of region.

Thus, when any measurement visual field is determined to be in the white state, the positional deviation of the wafer W can be corrected by horizontally moving the supporting pins 132A to 132C so that they get close to the measurement visual field from the wafer center in the reference position Wst. Also, in case that any measurement visual field is determined to be in the black state, the positional deviation of the wafer W can be corrected by horizontally moving the supporting pins 132A to 132C so that they become far from the measurement visual field toward the wafer center in the reference position Wst. Further, in case that black/white determination is made in a plurality of measurement visual field, the direction of the deviation can be estimated by a combination thereof. Therefore, by determining the direction for adjusting the deviation according to the combination of the black/white determinations, the positional deviation of the wafer W can be adjusted. Thus, even in case that the position of the wafer W cannot be detected, it is still possible to adjust the position of the wafer W in the direction along which the positional deviation is roughly corrected.

Combination patterns of such black/white determinations and directions of position adjustment of the wafer W are described in a table of FIG. 6. Further, specific examples of positions of the wafer W in each case of combination patterns P1 to P6 in FIG. 6 are illustrated in FIGS. 7 to 12.

Figure 7:
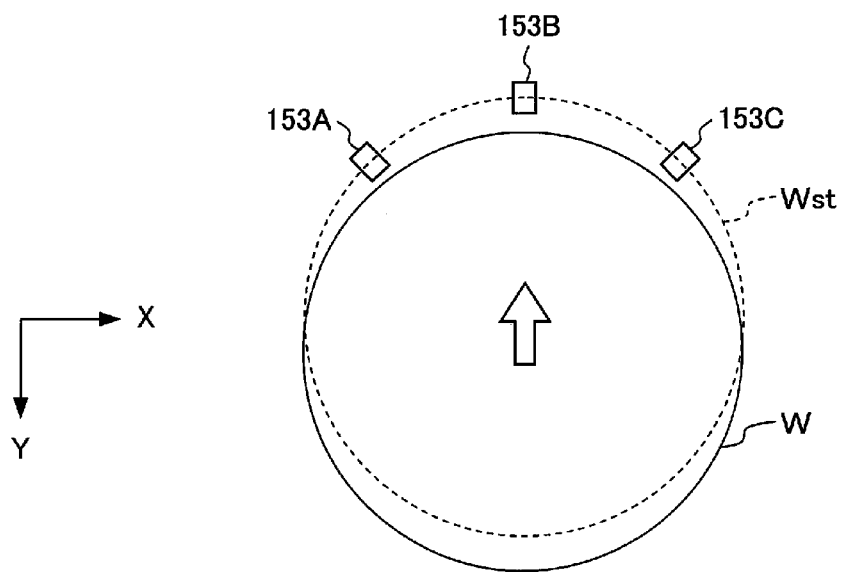
FIG. 7 is a diagram illustrating a specific example of a wafer position in a combination pattern P1 of black/white determination shown in FIG. 6.

A combination pattern P1 of the black/white determinations shows a case that the measurement visual fields 153A to 153C are all in the white states. In this case, as illustrated in FIG. 7, the center of the wafer W is severely deviated in a direction along which it is distanced away from all of the measurement visual fields 153A to 153C, that is, a plus direction of a Y axis. In such case, a reverse direction thereto, that is, a direction obtained by composing each of the directions (direction vectors) from the wafer center in the reference position Wst to each of measurement visual fields 153A to 153C becomes a position adjusting direction. More specifically, as shown by a large arrow, a minus direction (−90 degrees on XY coordinates) of the Y axis becomes the position adjusting direction, and the positional deviation of the water W can be adjusted by horizontally moving the wafer W in this direction.

Figure 8:
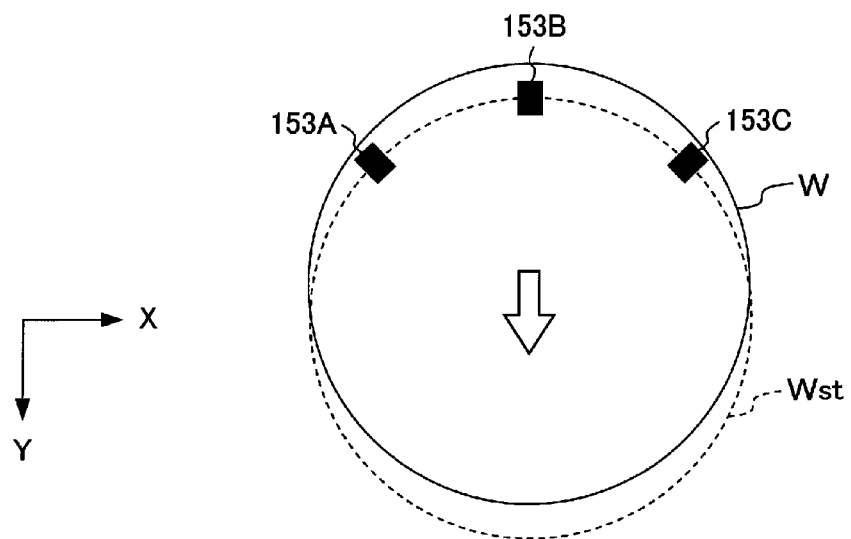
FIG. 8 is a diagram illustrating a specific example of a wafer position in a combination pattern P2 of black/white determination shown in FIG. 6.

A combination pattern P2 of black/white determinations illustrates a case that the measurement visual fields 153A to 153C are all in the black states. In this case, as illustrated in FIG. 8, the center of the wafer W is severely deviated in a direction along which it gets close to all of the measurement visual fields 153A to 153C, that is, a minus direction of the Y axis. In such case, a reverse direction thereto, that is, a direction obtained by composing each of directions from the wafer center in the reference position Wst to each of the measurement visual fields 153A to 153C becomes a position adjusting direction. More specifically, as shown by a large arrow, the plus direction (−180 degrees on XY coordinates) of the Y axis becomes the position adjusting direction, and the positional deviation of the water W can be adjusted by horizontally moving the wafer W in this direction.

Figure 9:
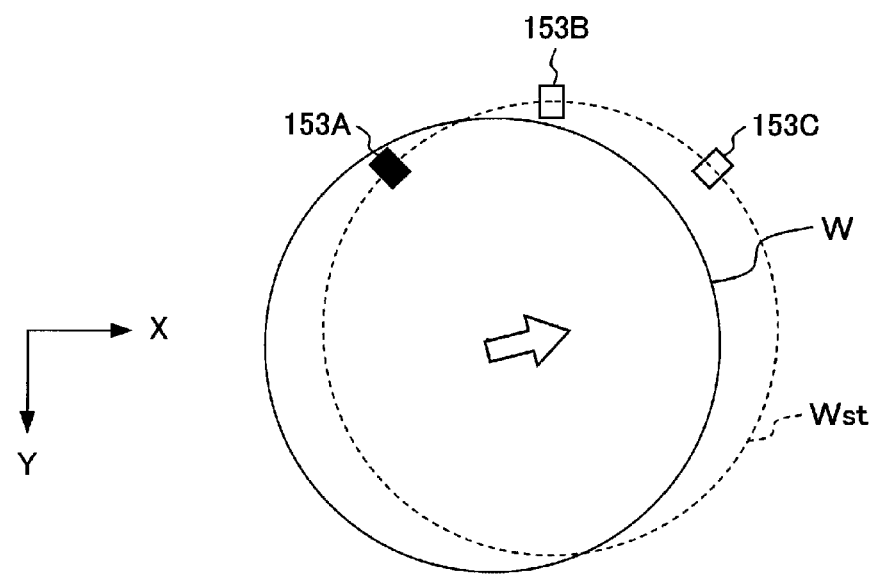
FIG. 9 is a diagram illustrating a specific example of a wafer position in a combination pattern P3 of black/white determination shown in FIG. 6.

A combination pattern P3 of black/white determinations describes a case that the measurement visual field 153A is determined to be in the black state while the other measurement visual fields 153B and 153C are in the white states. In this case, as illustrated in FIG. 9, the center of the wafer W is severely deviated in a direction along which it approaches the measurement visual field 153A while being distanced away from the measurement visual fields 153B and 153C. In such case, a reverse direction thereto, that is, a direction obtained by composing a direction from the measurement visual field 153A to the wafer center in the reference position Wst and directions from the wafer center in the reference position Ws to each of the measurement visual fields 153B and 153C becomes a position adjusting direction. More specifically, as shown by a large arrow, −35.26 degrees on XY coordinates becomes the position adjusting direction, and the positional deviation of the water W can be adjusted by horizontally moving the wafer W in this direction.

Figure 10:
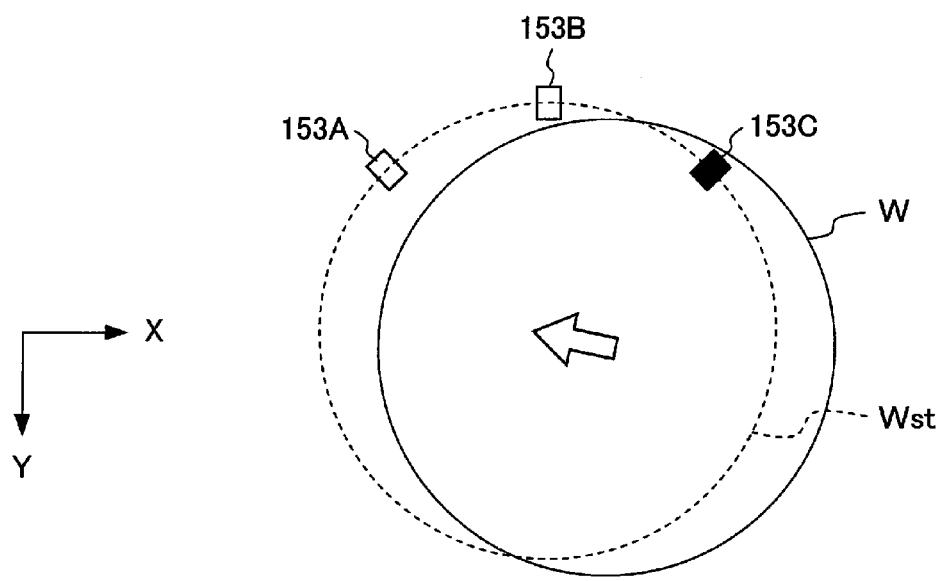
FIG. 10 is a diagram illustrating a specific example of a wafer position in a combination pattern P4 of black/white determination shown in FIG. 6.

A combination pattern P4 of black/white determinations illustrates a case that the measurement visual field 153C is determined to be in the black state while the other measurement visual fields 153A and 153B are in the white states. In this case, as illustrated in FIG. 10, the center of the wafer W is severely deviated in a direction along which it approaches the measurement visual field 153C while being distanced away from the measurement visual fields 153A and 153B. In such case, a reverse direction thereto, that is, a direction obtained by composing a direction from measurement visual field 153C to the wafer center in the reference position Wst and directions from the wafer center in the reference position Ws to each of the measurement visual fields 153A and 153B becomes a position adjusting direction. More specifically, as shown by a large arrow, −125.26 degrees on the XY coordinates becomes the position adjusting direction, and the positional deviation of the water W can be adjusted by horizontally moving the wafer W in this direction.

Figure 11:
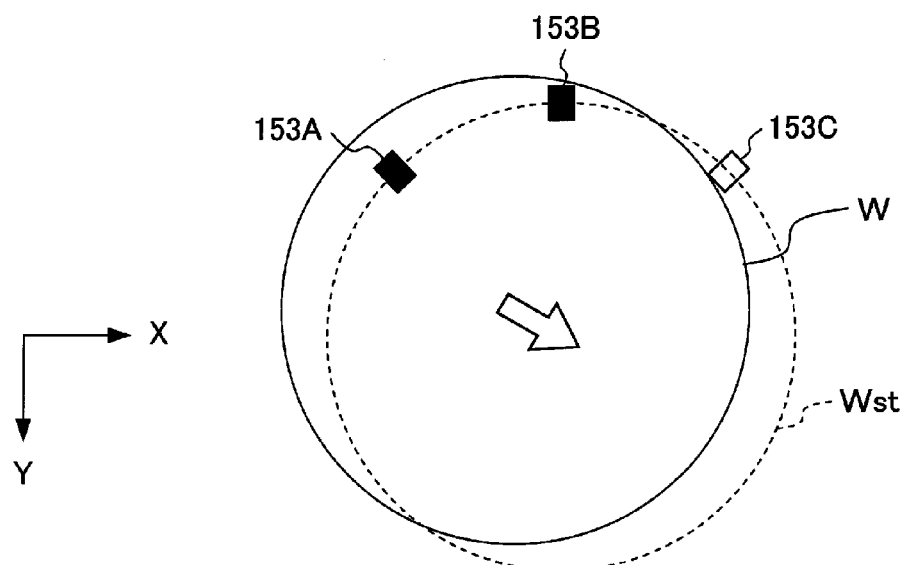
FIG. 11 is a diagram illustrating a specific example of a wafer position in a combination pattern P5 of black/white determination shown in FIG. 6.

A combination pattern P5 of black/white determinations shows a case that the measurement visual fields 153A and 153B are determined to be in the black states while the measurement visual field 153C is in the white state. In this case, as illustrated in FIG. 11, the center of the wafer W is severely deviated in a direction along which it comes nearer to the measurement visual fields 153A and 153B while being distanced away from the measurement visual field 153C. In such case, a reverse direction thereto, that is, a direction obtained by composing directions from each of the measurement visual fields 153A and 153B to the wafer center in the reference position Wst and a direction from the center of the wafer in the reference position Wst to the measurement visual field 153C becomes a position adjusting direction. More specifically, as shown by a large arrow, 35.26 degrees on the XY coordinates becomes the position adjusting direction, and the positional deviation of the water W can be adjusted by horizontally moving the wafer W in this direction.

Figure 12:
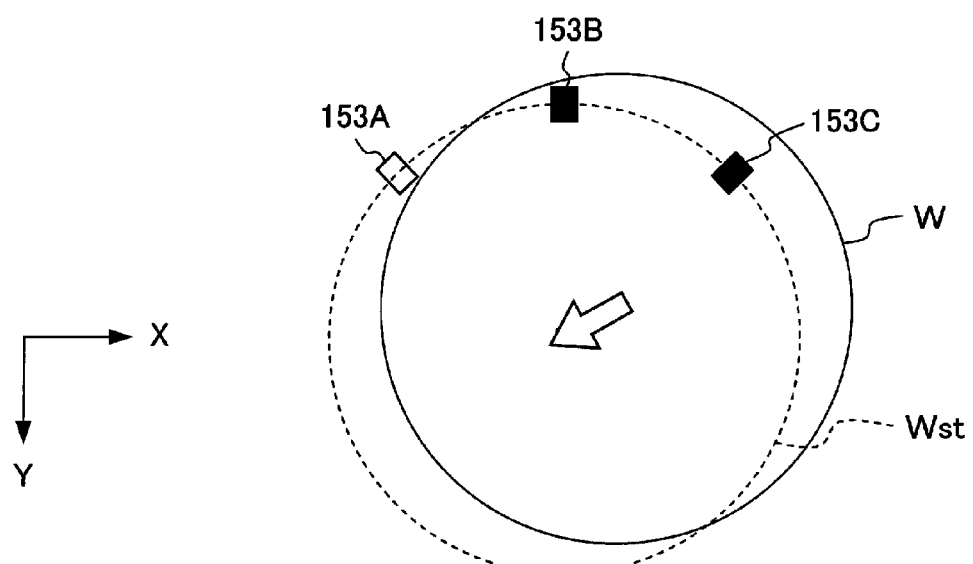
FIG. 12 is a diagram illustrating a specific example of a wafer position in a combination pattern P6 of black/white determination shown in FIG. 6.

A combination pattern P6 of black/white determinations describes a case that the measurement visual fields 153B and 153C are determined to be in the black states while the other measurement visual field 153A is in the white state. In this case, as illustrated in FIG. 12, the center of the wafer W is severely deviated in a direction along which it approaches the measurement visual fields 153B and 153C while being distanced away from the measurement visual field 153A. In such case, a reverse direction thereto, that is, a direction obtained by composing directions from each of the measurement visual fields 153B and 153C to the wafer center in the reference position Wst and a direction from the wafer center in the reference position Ws to the measurement visual field 153A becomes a position adjusting direction. More specifically, as shown by a large arrow, −215.26 degrees on the XY coordinates becomes the position adjusting direction, and the positional deviation of the water W can be adjusted by horizontally moving the wafer W in this direction.

Further, besides the combination patterns P1 to P6 of black/white determination illustrated in FIG. 6, there can be a case that the measurement visual fields 153A and 153C are determined to be in the white states while the measurement visual field 153B is determined to be the black state or a case that the measurement visual fields 153A and 153C are determined to be in the black states while the measurement visual field 153B is determined to be in the white state. However, in such arrangement of the measurement visual fields 153A to 153C (arrangement of the imaging units 152A to 152C) as illustrated in FIG. 5, in case that the measurement visual fields 153A and 153C located on both ends are in the white states, the measurement visual field interposed between them is typically in the white state as well; and in case that the measurement visual fields 153A and 153C are in the black states, the measurement visual field 153B is typically in the black state as well. Therefore, these two patterns are omitted herein. Also, depending on the arrangement of the measurement visual fields 153A to 153C (arrangement of the imaging units 152A to 152C), there may occur cases that these two patterns are also required.

As described, in case that the wafer W is so deviated that the peripheral portion of the wafer W cannot be detected within the measurement visual fields 153A to 153C, the adjustment of the position of the wafer W is performed by calculating the adjusting direction of the wafer W according to the black/white determination of the measurement visual fields. In this way, since the wafer W can be moved to the position where the detection of its peripheral portion is possible, the position of the wafer W can be detected more accurately even when the wafer W is severely deviated.

Figure 13:
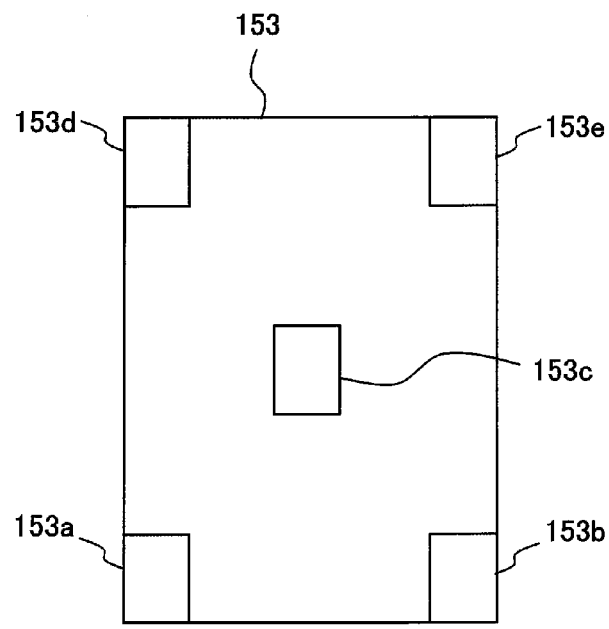
FIG. 13 is a diagram illustrating a configuration example of plural regions of a measurement visual field with respect to an imaging unit in accordance with the present embodiment.

Hereinafter, there will be described a specific example of a method capable of executing both of the presence/absence determination (grey determination) of the peripheral portion of the wafer W and the black/white determination which can be performed when the peripheral portion of the wafer W cannot be detected, depending on the measurement visual fields 153A to 153C. FIG. 13 illustrates a configuration example of measurement regions of a measurement visual field, and FIGS. 14 to 17 describe a relationship between each state of the measurement visual field and a position of the wafer W. The measurement visual field 153 illustrated in FIGS. 13 to 17 represents the measurement visual fields 153A to 153C in the description, and each of the measurement visual fields 153A to 153C has the same configuration as the measurement visual field 153.

As illustrated in FIG. 13, for example, five measurement regions 153a to 153e are set as the measurement visual field 153. The measurement regions 153a and 153b are disposed near the central side of the wafer W; the measurement regions 153d and 153e are disposed near the peripheral side of the wafer W; and the measurement region 153c is disposed at a center between them. By detecting the brightness state (black/white state) of the measurement regions 153a to 153e disposed as described above, both the presence/absence determination (grey determination) of the peripheral portion of the wafer W and the black/white determination can be carried out by a simple algorithm.

Figure 14:
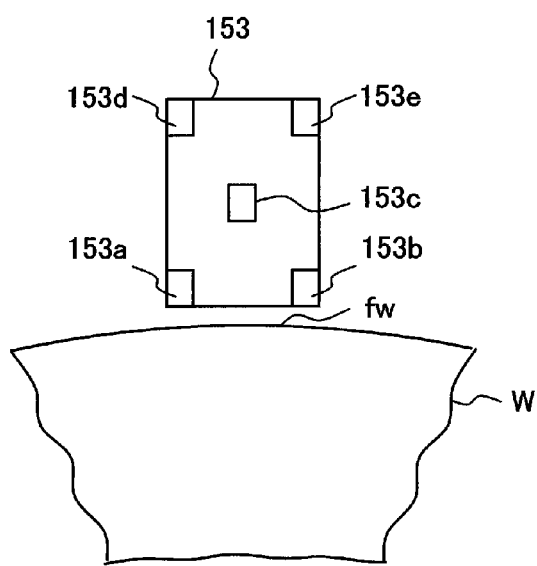
FIG. 14 is a diagram for describing a relationship between a state of each measurement visual field and a position of a wafer W, which shows an example where the measurement visual field is considered to be in a white state (bright state)
Figure 15:
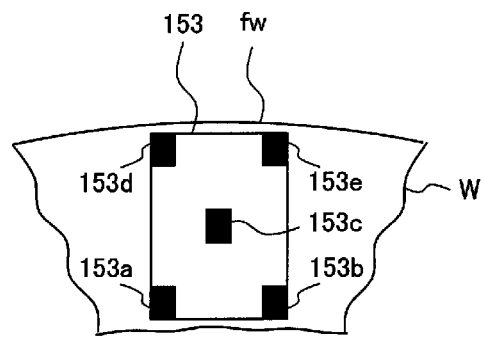
FIG. 15 is a diagram for describing a relationship between a state of each measurement visual field and a position of a wafer W, which shows an example where the measurement visual field is considered to be in a black state (dark state)

For example, as illustrated in FIG. 14, in case that all the measurement regions 153a to 153e are in the white states, the peripheral portion fw of the wafer W does not exist therein because the wafer W does not exist within the measurement visual field 153. In this case, the measurement visual field 153 may be determined to be in the white state. Further, as illustrated in FIG. 15 for example, in case that all the measurement regions 153a to 153e are in the black states, the peripheral portion fw of the wafer W dose not exist therein, either, though the wafer W exists in the measurement visual field 153. In such case, the measurement visual field 153 may be determined to be in the black state. Moreover, in case that the measurement regions 153a and 153b are determined to be in the white states and at least one of the rest measurement regions 153c to 153e is determined to be in the black state, the measurement visual field 153 may be determined to be in an abnormal state. In such case, a breakage of the wafer W or a breakdown of the imaging units is likely to occur.

Figure 16:
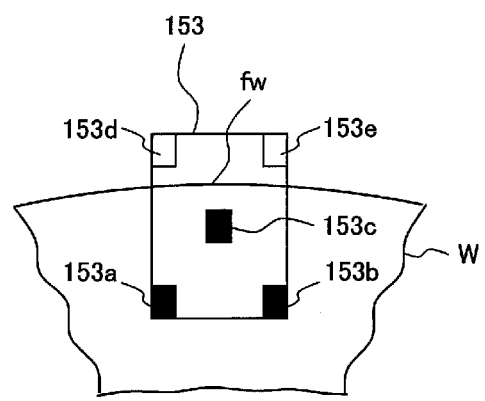
FIG. 16 sets forth a diagram for describing a relationship between a state of each measurement visual field and a position of a wafer W, which shows an example where the measurement visual field is considered to be in a grey state (peripheral portion presence state)
Figure 17:
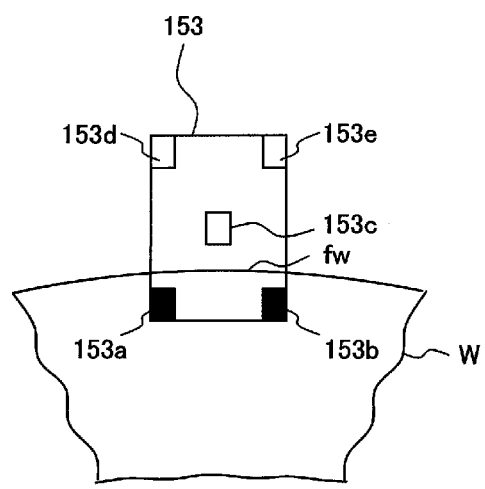
FIG. 17 depicts a diagram for describing a relationship between a state of each measurement visual field and a position of a wafer W, which shows another example where the measurement visual field is considered to be in a grey state (peripheral portion presence state)

Furthermore, in case that the brightness states (black/white state) of the measurement regions 153a to 153e are other than those in which the measurement visual field 153 is determined to be in the white state, the black state, and the abnormal state, it implies that the peripheral portion fw of the wafer W exists within the measurement visual field 153. Therefore, in this case, the measurement visual field 153 can be determined to be in the peripheral portion presence state (grey state). For example, as illustrated in FIG. 16, when the measurement regions 153a to 153c are in black states while the measurement regions 153d and 153e are in white states, the measurement visual field 153 can be determined to be in the peripheral portion presence state (grey state). Further, as illustrated in FIG. 17, even in case that only the measurement regions 153a and 153b are in black states, the measurement visual field 153 can be determined to be in the peripheral portion presence state (grey state). In addition, the determination method by the measurement visual field 153 is not limited to the above-described example.

By means of the substrate position detecting device 150 in accordance with the present embodiment, the wafer peripheral portion can be detected while the wafer W is being supported by the supporting pins 132A to 132C, the position of the wafer W can be detected faster than in the conventional case of rotating the wafer W one time after re-mounting it on the mounting table. Further, even in case that the positional deviation of the wafer W is so great that the detection of the peripheral portion thereof is not possible by the substrate position detecting device 150, the position adjusting direction of the wafer W can be calculated based on the combination of black/white determinations as described above. If the position of the wafer W is adjusted by the supporting pins 132A to 132C in this way, the position of the wafer W can be detected.

Further, since the positioning of the wafer W in the horizontal direction is performed by the X-directional driving unit 138X and the Y-directional driving unit 138Y, which have a high resolution and are drivable at a high speed, the wafer W can be mounted at an accurate position (reference position Wst) on the mounting surface of the mounting table 112 in short time. Therefore, the throughput of the wafer processing can be improved, and the processing on the wafer W mounted on the mounting table 112 can be performed accurately and precisely.

Each component of the above mentioned mounting unit 110, the substrate transfer device 130, and the substrate position detecting device 150 is controlled by the control unit 200. The control unit 200 includes, for example, a CPU (Central Processing Unit) constituting a control unit main body; a ROM (Read Only Memory) for storing therein data required for performing a process by the CPU; a RAM (Random Access Memory) having a memory region used for various kinds of data processing performed by the CPU; a storage unit such as a hard disk (HDD) or a memory which stores therein programs or data to be used in controlling each component by the CPU, and so forth. Further, when performing the position adjustment of the wafer W by the black/white determination of the above described measurement visual fields 153A to 153C, it may be also possible to store the combination patterns of black/white determination of the measurement visual fields 153A to 153C and the position adjusting direction of the wafer W, as shown in FIG. 6, in the aforementioned storage unit as a substrate position adjustment data table and then to read the corresponding position adjusting direction according to the combination patterns of black/white determination.

Moreover, the control unit 200 performs a wafer transfer process by controlling each component of the substrate transfer device 130 and the substrate position detecting device 150 based on preset programs read from the storage unit. The transfer process includes a process of transferring a wafer onto the mounting table 112 by lifting up and receiving the wafer W from the transfer arm and a process of mounting the wafer W on the transfer arm between the mounting table 112 and the wafer W by lifting up and receiving the wafer W from the mounting table 112.

(Substrate Transfer Process)

Figure 18:
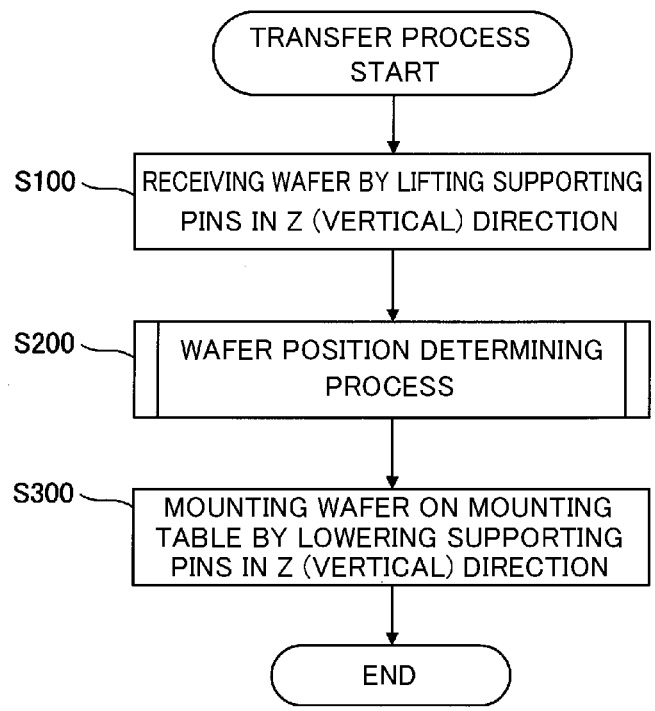
FIG. 18 is a flow chart for describing example of a wafer transfer process in accordance with the same embodiment.

Hereinafter, a specific example of the aforementioned transfer process of the wafer W will be described with reference to the accompanying drawings. FIG. 18 is a flow chart illustrating an example of the transfer process for receiving the wafer from the transfer arm and mounting it on the mounting table. Further, FIGS. 19A to 19E are explanatory operation diagrams to describe an operation example of the substrate transfer device 130 in the transfer process. In FIGS. 19A to 19E, Cw represents the center of the wafer W, and Ct represents the wafer center in the reference position Wst described above.

Figure 19A:
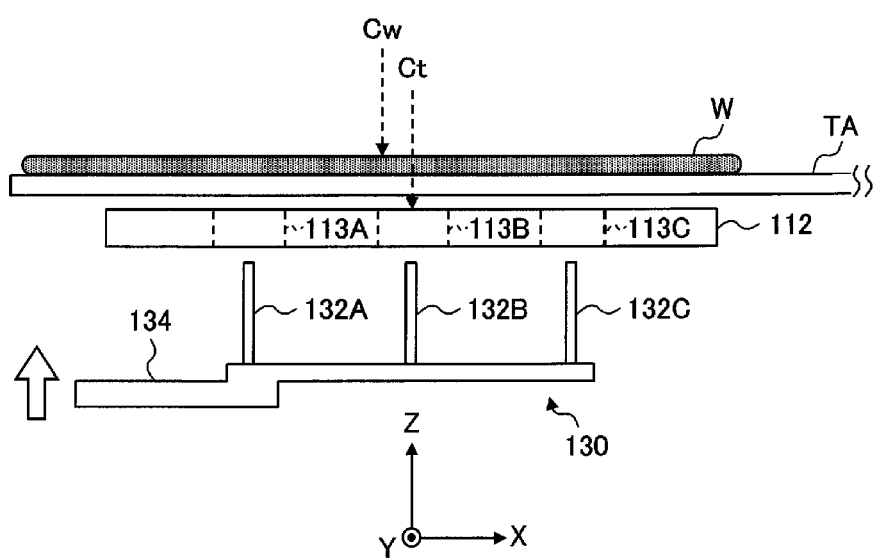
FIG. 19A is a diagram for describing an operation example of the substrate transfer device.
Figure 19B:
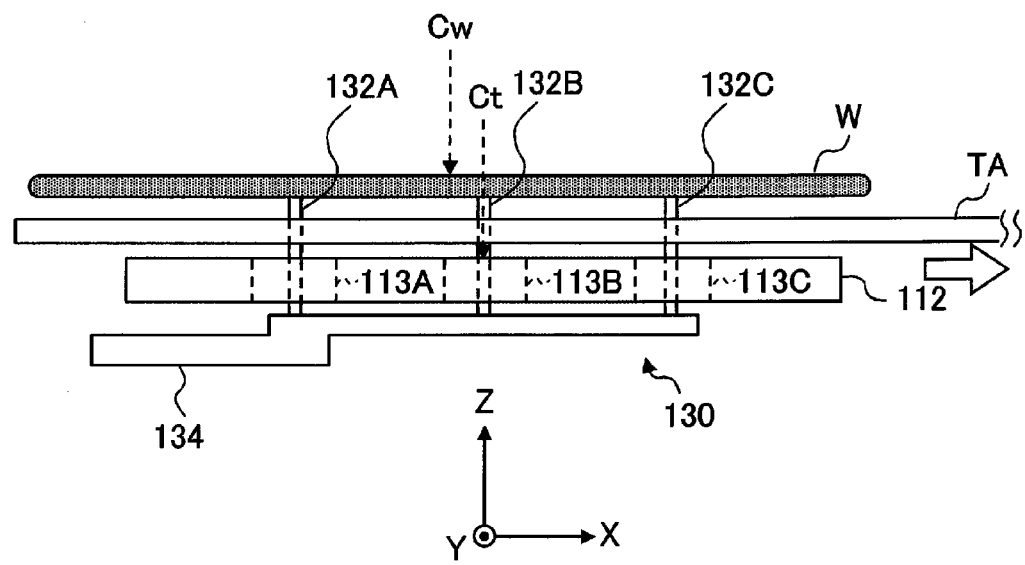
FIG. 19B is a diagram for describing an operation example of the substrate transfer device.
Figure 19C:
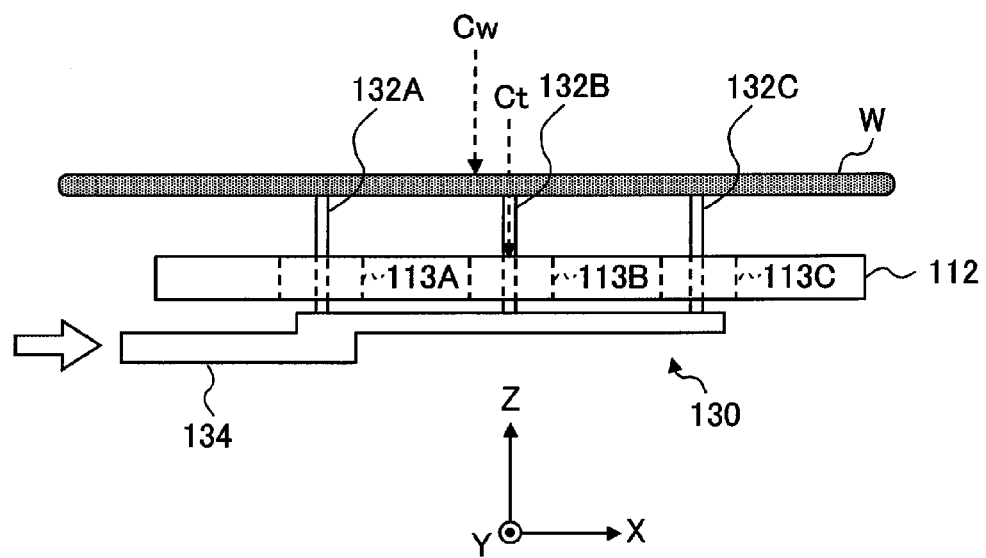
FIG. 19C is a diagram for describing an operation example of the substrate transfer device.

When transferring the wafer W on the transfer arm TA to the mounting table 112, the supporting pins 132A to 132C are first elevated so that the wafer W on the transfer arm TA is received by them in step S100. More specifically, as illustrated in FIG. 19A, if the transfer arm TA loaded with the wafer W is inserted above the mounting table 112, the supporting pins 132A to 132C are lifted up to a preset reception height of the wafer W in the Z (vertical) direction by driving the Z-directional driving unit 138Z. Accordingly, the leading ends of the respective supporting pins 132A to 132C are protruded upward from the mounting surface of the mounting table 112 through the through holes 113A to 113C, and are raised so that the wafer on the transfer arm TA is lifted as illustrated in FIG. 19B. Thus, if the wafer W is received on the leading ends of the supporting pins 132A to 132C, the transfer arm TA is withdrawn from above the mounting table 112, as illustrated in FIG. 19B, so that a state as illustrated in FIG. 19C is obtained.

As described, in the present embodiment, though the wafer W is received from the transfer arm TA by the supporting pins 132A to 132C by lifting the supporting pins 132A to 132C, the present invention is not necessarily limited thereto. For example, in case that the transfer arm TA is movable up and down, the wafer W may be moved down onto the leading ends of the supporting pins by lowering the transfer arm TA. In such case, in the state that the supporting pins 132A to 132C are lifted in the Z axis direction by driving the Z-directional driving unit 138Z, the transfer arm loaded with the wafer W is inserted above the mounting table 112. Then, by lowering the transfer arm TA, the wafer is received by the supporting pins 132A to 132C. In this way, the reception of the wafer W can be carried out while the supporting pins 132A to 132C are kept lifted.

Furthermore, as illustrated in FIG. 19A, when the transfer arm TA is inserted above the mounting table 112, if there occurs a positional deviation of the wafer in the horizontal direction (here, a deviation of the center Cw of the wafer W with respect to the wafer center (reference center) Ct in the reference position Wst), the wafer W is raised upward by the supporting pins 132A to 132C.

In a wafer position determining process in step S200, a horizontal deviation of the wafer W is detected by the substrate position detecting device 150 while the wafer w is supported by the supporting pins 132A to 132C. In case that a deviation from the reference position Wst does not occur, the supporting pins 132A to 132C are immediately lowered so that the wafer W is mounted on the mounting table 112 in step S300. On the other hand, when a positional deviation from the reference position Wst occurs, the deviation is corrected by moving the supporting pins 132A to 132C in the horizontal direction by the substrate transfer device 130, as illustrated in FIG. 19C.

Figure 19D:
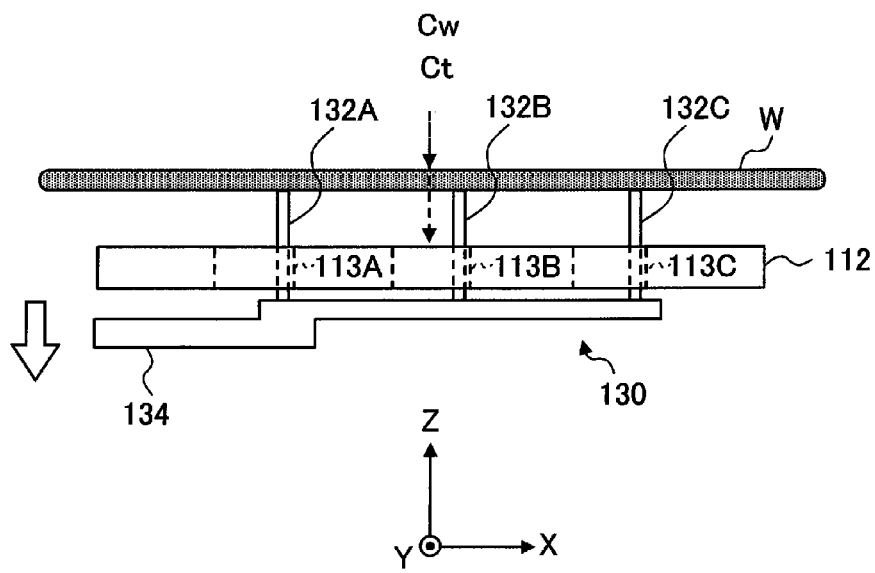
FIG. 19D is a diagram for describing an operation example of the substrate transfer device.

As a result, position alignment can be accomplished such that the center Cw of the wafer W and the wafer center Ct in the reference position Wst are coincident as illustrated in FIG. 19D. As described, since the positional deviation of the wafer W can be corrected by the substrate transfer device 130, the transfer arm TA can start a next operation (for example, an operation of transferring other wafers) after transferring the wafer W onto the supporting pins, so that the throughput of the wafer processing can be improved. An example of the wafer position determining process in step S200 will be explained later in detail.

Figure 19E:
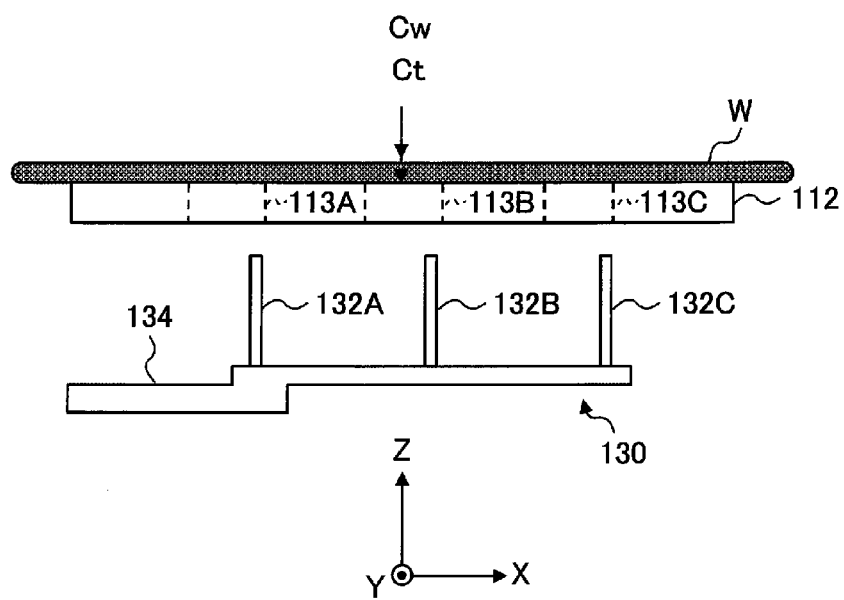
FIG. 19E is a diagram for describing an operation example of the substrate transfer device.

Upon the completion of the wafer position determining process in step S200, the wafer W is mounted on the mounting table 112 by lowering the supporting pins 132A to 132C in step S300. To be specific, as illustrated in FIG. 19D, the supporting pins 132A to 132C are lowered by driving the Z-directional driving unit 138Z, so that the wafer W is placed on the mounting table 112, as illustrated in FIG. 19D. As a result, the wafer W whose horizontal position has been corrected is mounted on the mounting table 112, as illustrated in FIG. 19E. Then, the transfer process of the wafer W is completed.

Further, when lowering the supporting pins 132A to 132C, it is desirable to make their leading ends recede below the mounting surface of the mounting table 112 through the through holes 113A to 113C. As a result, interference of the supporting pins 132A to 132C can be prevented when the mounting table 112 is rotated, for example.

In the position determining process in accordance with the present embodiment described above, the positioning of the wafer W is performed by using the substrate transfer device 130 configured to move the supporting pins 132A to 132C in the horizontal direction (XY direction). Therefore, since the wafer W can be moved in the horizontal direction by the supporting pins 132A to 132C without having to use the transfer arm TA after receiving the substrate from the transfer arm TA by the supporting pins, for example, the positional deviation can be corrected promptly. Accordingly, the throughput of the substrate processing can be improved.

(Wafer Position Determining Process)

Next, the aforementioned wafer position determining process (step S200) will be described in detail. The wafer position determining process in accordance with the present embodiment is performed based on the degree of the positional deviation of the wafer W. Depending on the degree of the positional deviation of the wafer W, there may occur an occasion that the peripheral portion of the wafer W cannot be detected by any of the imaging units 152A to 152C. Even in such case, if the wafer W can be moved to where the peripheral portion of the wafer W can be detected by all the imaging units 152A to 152C, it would be possible to detect the position of the wafer W accurately, thus enabling an accurate position determination of the wafer.

Here, the degree of the positional deviation of the wafer W is determined based on the number of the imaging units 152A to 152C capable of detecting the peripheral portion of the wafer W, and based on the determined degree of the positional deviation, the wafer position determining process is performed. More specifically, in case that the wafer peripheral portion can be detected by at least one of the imaging units, a deviation from the reference position Wst is calculated based on the horizontal position of the wafer W obtained from the shape of the peripheral portion, and when the deviation exceeds a tolerance range, the deviation is corrected by moving the wafer in the horizontal direction.

In this case, when the peripheral portion of the wafer W can be detected by, for example, the three imaging units 152A to 152C, the center of the wafer W can be accurately calculated from the shapes of the peripheral portion obtained by each of the imaging units 152A to 152C. Therefore, if the positional deviation of the wafer W occurs, the positional deviation can be corrected accurately by aligning the center of the wafer W to the wafer center in the reference position Wst.

Furthermore, even in case that the peripheral portion of the wafer W can be detected by a part of (herein, one or two) the imaging units though not by all of the three imaging units 152A to 152C, the center of the wafer W can be calculated from the detected shape of the peripheral portion. However, when considering detection accuracy of the center of the wafer W, the detection accuracy is deteriorated as the number of the imaging units capable of detecting the peripheral portion of the wafer W decreases. Here, when the wafer peripheral portion can be detected by the one or two imaging units, a rough center position of the wafer W is calculated only from the shape of the peripheral portion of the wafer W detectable by the imaging unit, and the position of the wafer W is roughly corrected so that the rough center position of the wafer W becomes coincident with the wafer center in the reference position Wst, whereby the wafer W can be moved to the position where detection of the peripheral portion of the wafer W can be possible by all of the imaging units 152A to 152C.

On the other hand, in case that the wafer W is so severely deviated that the peripheral portion of the wafer W cannot be detected, a detection of the center of the wafer W is not possible. In accordance with the present invention, however, a direction for adjusting the wafer W can be still calculated even in such case by performing a black/white determination (see FIGS. 6 to 12) by the imaging units 152A to 152C as described above.

Here, when the peripheral portion of the wafer W cannot be detected by any of the imaging units 152A to 152C, the position of the wafer W is adjusted by gradually moving the wafer W by a predetermined amount along the adjusting direction obtained by the black/white determination. Thus, the wafer can be moved to a position where the peripheral portion of the wafer W can be detected by at least one imaging unit.

Figure 20:
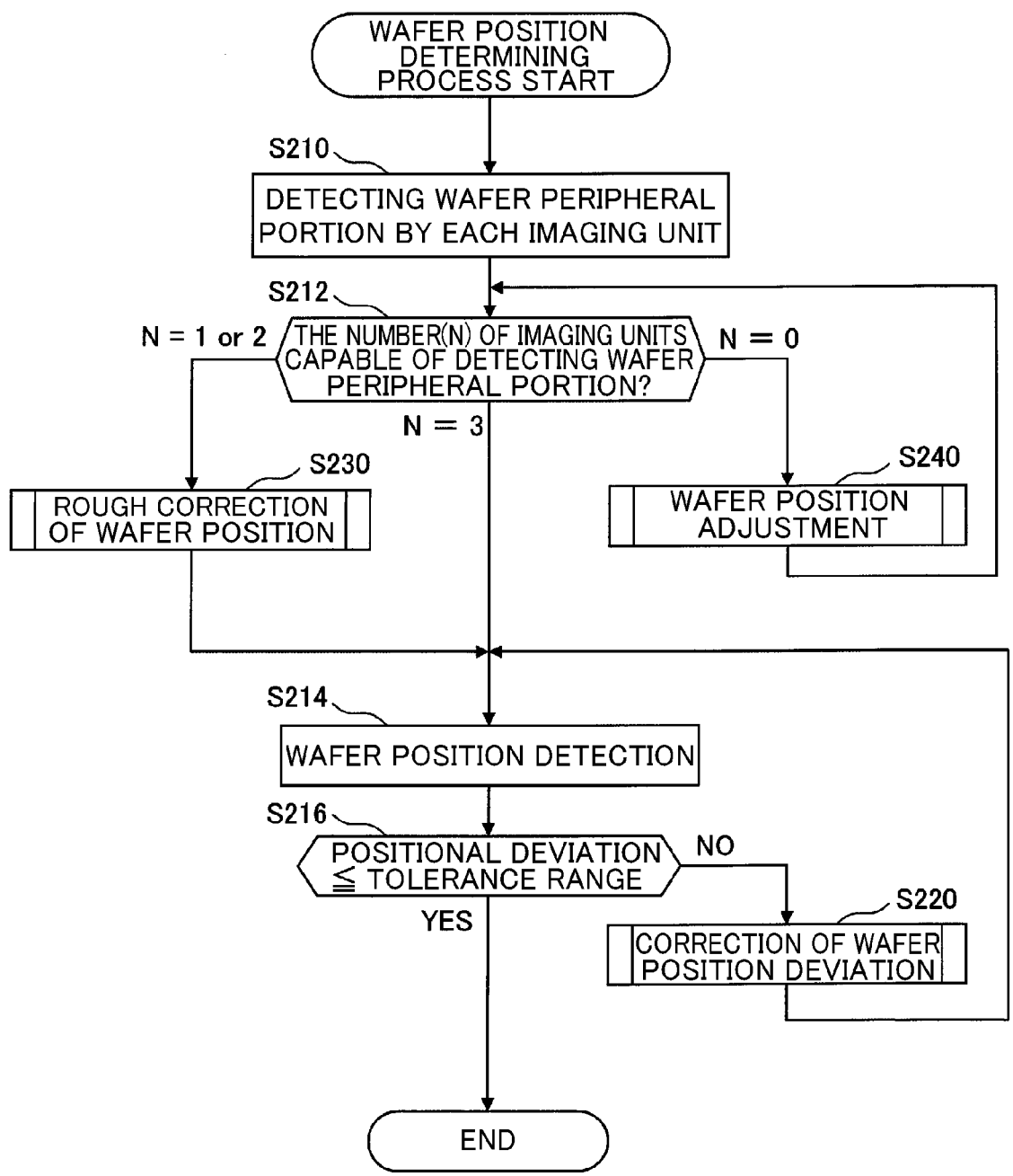
FIG. 20 is a flow chart for describing a specific example of a wafer position determining process in accordance with the same embodiment.

An example of the position determining process of the wafer W in accordance with the present embodiment will be described in detail with reference to the accompanying drawings. FIG. 20 is a flow chart illustrating the specific example of the wafer position determining process. First, in step S210, the peripheral portion of the wafer W transferred from the transfer arm TA onto the supporting pins 132A to 132C is detected by each of the imaging units 152A to 152C (substrate peripheral portion detecting process). Here, the wafer peripheral portion is detected based on the output image data of the measurement visual fields 153A to 153C captured by the imaging units 152A to 152C of the substrate position detecting device.

In this case, by detecting brightness states (black/white state) of the measurement regions 153a to 153e as illustrated in FIG. 13 for each of the measurement visual fields 153A to 153C, the presence/absence determination (grey determination) of the peripheral portion of the wafer W is performed. For example, for the states of the measurement regions 153a to 153e as illustrated in FIGS. 14 and 15, it would determined that the wafer peripheral portion cannot be detected, while it would be determined that, for the states of the measurement regions 153a to 153e as illustrated in FIGS. 16 and 17, the wafer peripheral portion can be detected.

Subsequently, in step S212, the number (N) of the imaging units capable of detecting the wafer peripheral portion is determined. At this time, in case that the wafer peripheral portion can be detected within the measurement visual fields 153A to 153C of all the imaging units 152A to 152C (N=3), the position of the wafer W is detected in step S214 (substrate position detecting process). That is, by acquiring the center of the wafer W based on shapes of the peripheral portion of the wafer W detected respectively within the measurement visual fields 153A to 153C of the imaging units 152A to 152C, the position of the wafer W (wafer center position on the XY coordinates) is calculated.

Figure 24A:
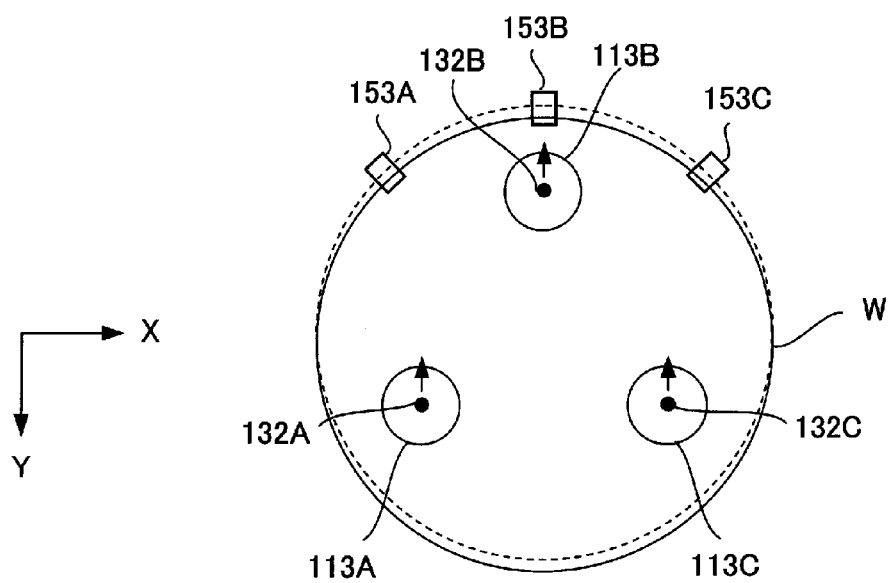
FIG. 24A is a diagram illustrating an example of a wafer position when a wafer peripheral portion can be detected in measurement visual fields of all imaging units.

Subsequently, in step S216, the deviation of the wafer W from the reference position Wst is detected, and it is determined whether the deviation is within the tolerance range. For example, as illustrated in FIG. 24A, an amount of deviation of the center of the wafer W from the wafer center in the reference position Wst is calculated, and it is determined whether the deviation amount is within the preset tolerance range. Here, the tolerance range is set based on the configuration of the mounting table 112, the processing chamber or the like, the kind of a process performed on the wafer, and the like. For example, in case of processing the wafer W while rotating the end portion of the wafer W on the mounting table 112, it is desirable to align the center of the wafer W to the reference position (here, a rotation center position of the mounting table 112) Wst with a higher precision than that in case of processing the wafer W without rotating the mounting table 112. In this case, the tolerance range is set to be, for example, about 100 μm.

Moreover, when it is determined in step S216 that the positional deviation of the wafer W is within the tolerance range, the correction of positional deviation of the wafer W need not be performed, so that the series of position determining process is terminated, and the process goes back to step S300 in FIG. 18, in which the wafer W is mounted on the mounting table 112 by lowering the supporting pins 132A to 132C. To the contrary, if the positional deviation of the wafer W is determined to exceed the tolerance range in step S216, the correction of the positional deviation of the wafer W is performed in step S220 (substrate deviation correcting process).

(Correction of Wafer Position Deviation)

Figure 21:
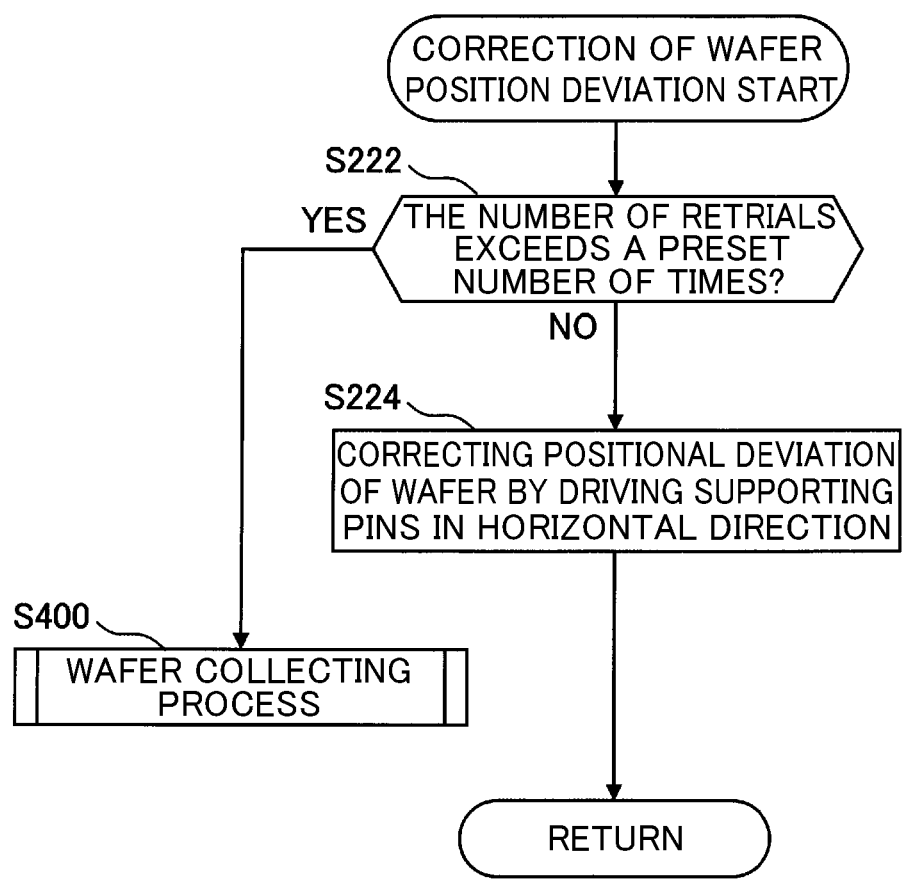
FIG. 21 is a flow chart for describing a specific example of a wafer position deviation correction shown in FIG. 20.

The above-described correction of the positional deviation of the wafer W is performed based on, for example, a flow chart illustrated in FIG. 21. Further, the correction of the positional deviation may be preformed only one time, or be set such that retrial is possible. FIG. 21 shows a case in which the process can be retried as many as a preset number of times.

First, in step S222, it is determined whether the retrial number of the correction of the positional deviation exceeds the preset number of times (for example, twice). If the retrial number is found to exceed the preset number of times, a wafer collecting process is performed in step S400. On the other hand, if the retrial number is determined to be no greater than the preset number of times, the positional deviation of the wafer W is corrected in step S224 by driving the supporting pins 132A to 132C in the horizontal direction so that the center of the wafer W is aligned to the wafer center in the reference position Wst.

Figure 24B:
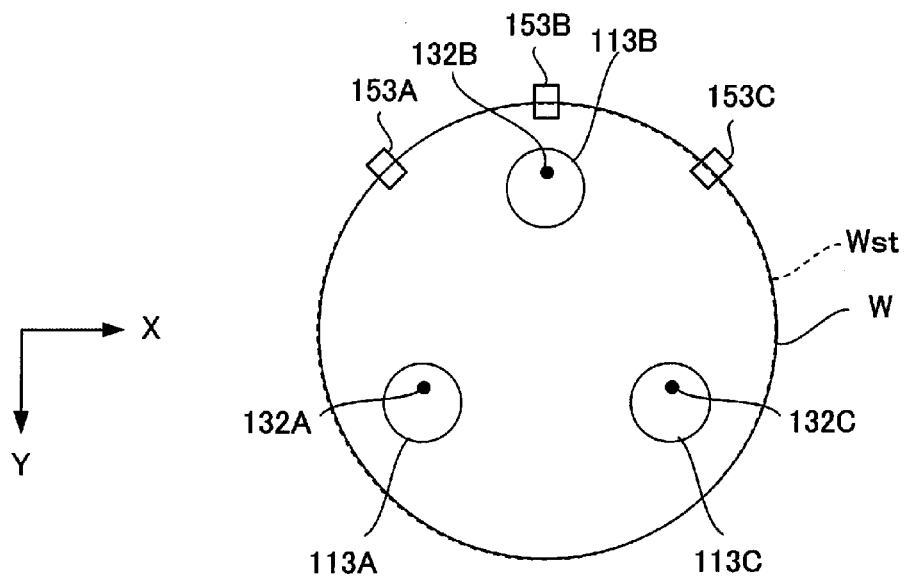
FIG. 24B is a diagram illustrating a positional relationship between supporting pins and a wafer when a positional deviation of FIG. 24A is corrected.

According to such position deviation correcting process for the wafer W, when the peripheral portion of the wafer W can be detected within the three measurement visual fields 153A to 153C such as illustrated in FIG. 24A, the center of the wafer W is acquired by using all of the shapes of the peripheral portion of the wafer W detected within the measurement visual fields 153A to 153C, and the positional deviation of the wafer W is corrected based thereon. Thus, as illustrated in FIG. 24B, the positional deviation of the wafer W can be corrected accurately.

Referring back to step S212, in case that the wafer peripheral portion can be detected within the measurement visual field of only one or two imaging units (N=1 or N=2), that is, in case that the wafer peripheral portion can be detected only by a part of the imaging units, a rough correction of the position of the wafer W is performed in step S230 (substrate position deviation correcting process).

(Rough Correction of the Wafer Position)

Figure 22:
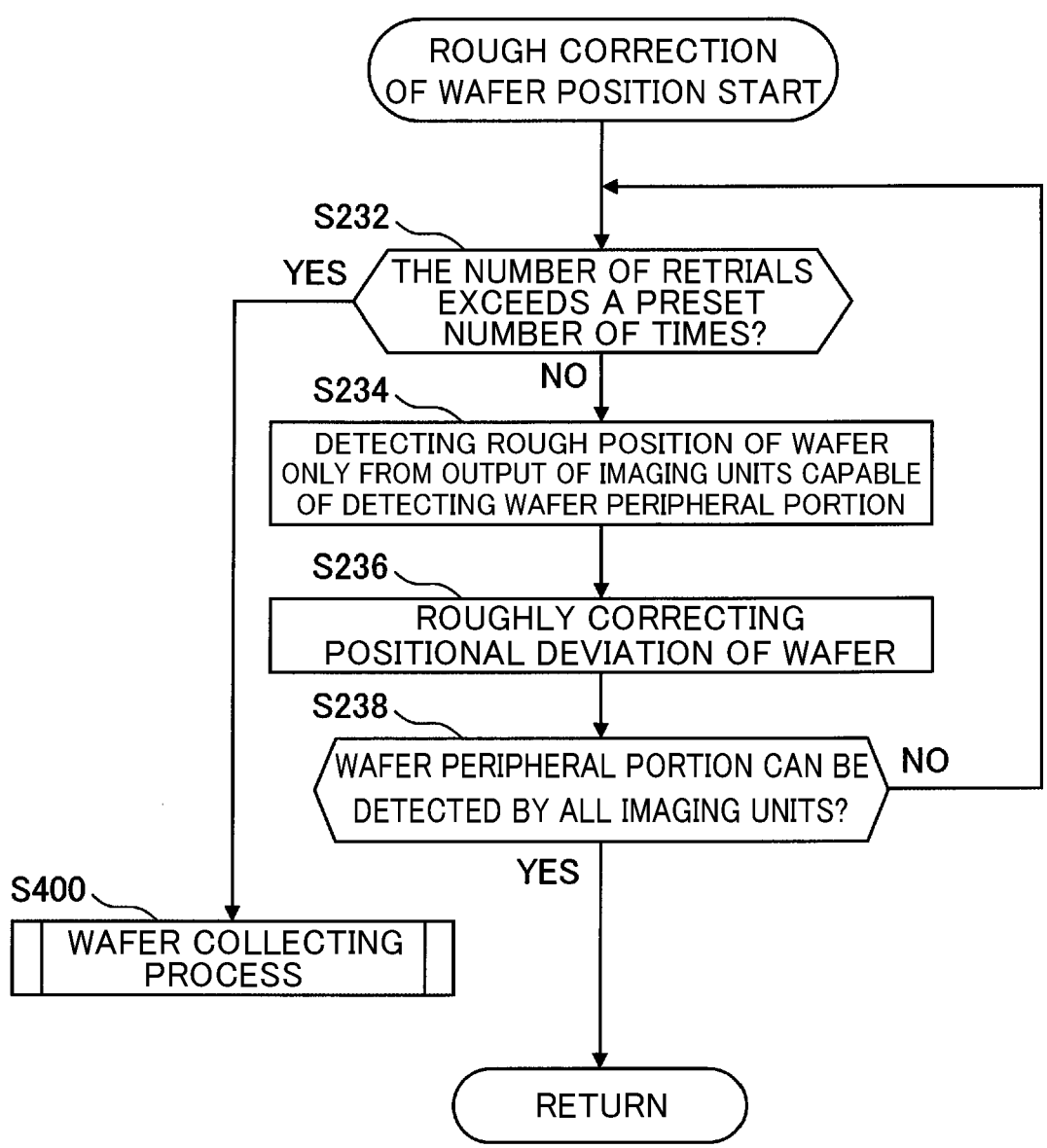
FIG. 22 is a flow chart for describing a specific example of a rough correction of a wafer position shown in FIG. 20.

The above-mentioned rough correction of the wafer position is executed based on, for example, a flow chart illustrated in FIG. 22. The rough correction may be performed only one time, or may be set such that retrial is possible. FIG. 22 illustrates a case in which the process can be retried as many as a predetermined number of times.

First, in step S232, it is determined whether the retrial number of the rough correction exceeds the predetermined number of times (for example, twice). If the retrial number is found to exceed the predetermined number of times, the wafer collecting process is performed in step S400.

On the other hand, if the retrial number is determined to be no greater than the predetermined number of times in step S232, the rough position (here, the rough center position) of the wafer W is detected based on only the output from imaging units capable of detecting the wafer peripheral portion in step S234. For example, when the wafer peripheral portion can be detected only within the measurement visual fields of, for example, two imaging units, the rough center position of the wafer is obtained only from wafer peripheral portion shapes detected from those two measurement visual fields. Further, when the wafer peripheral portion can be detected only within the measurement visual field of one imaging unit, the rough center position of the wafer is calculated only from a wafer peripheral portion shape detected from the one measurement visual field.

Here, the term "rough position" of the wafer W is used to distinguish it from the wafer position acquired with a highest accuracy when the number of the imaging units capable of detecting the wafer peripheral portion is three, noting that the accuracy of the position of the wafer W acquired from the outputs of the imaging units capable of detecting the wafer peripheral portion deteriorates as the number of such imaging units decreases.

Subsequently, in step S236, the deviation of the rough position of the wafer W from the reference position Wst is detected, and the positional deviation of the wafer W is corrected. That is, the positional deviation of the wafer W is roughly corrected by driving the supporting pins 132A to 132C in the horizontal direction so that the rough center position of the wafer W is aligned to the wafer center in the reference position Wst.

Then, in step S238, it is determined whether the wafer peripheral portion can be detected by all of the imaging units. If it is determined that the wafer peripheral portion cannot be detected by any of the three imaging units 152A to 152C, the process goes back to step S232, and the rough corrections are iterated within the limit of the preset number of times for retrial. On the other hand, if it is determined that the wafer peripheral portion can be detected by all of the three imaging units 152A to 152C, the series of rough correction process of wafer position is completed, and the process proceeds to step S214 described in FIG. 20.

Figure 25A:
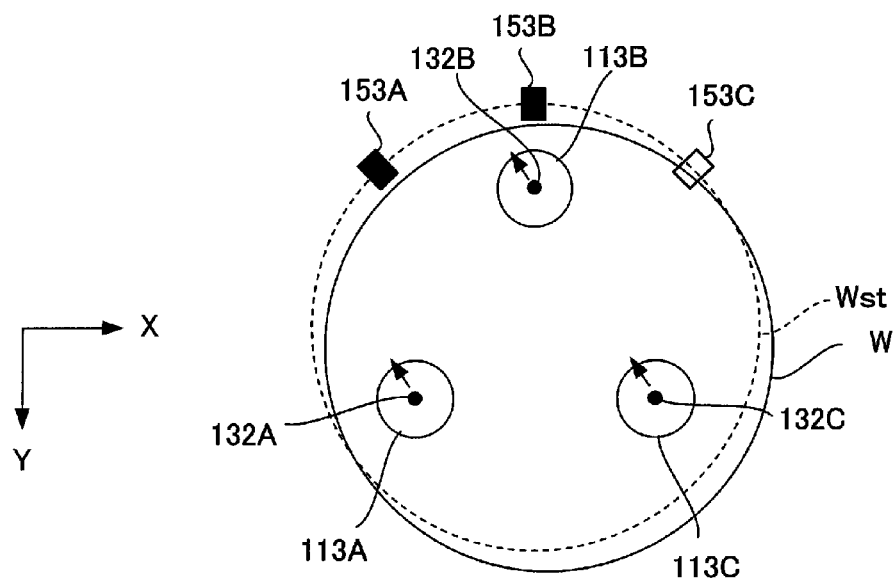
FIG. 25A provides a diagram showing an example of a wafer position when a wafer peripheral portion can be detected within a measurement visual field of one imaging unit.
Figure 25B:
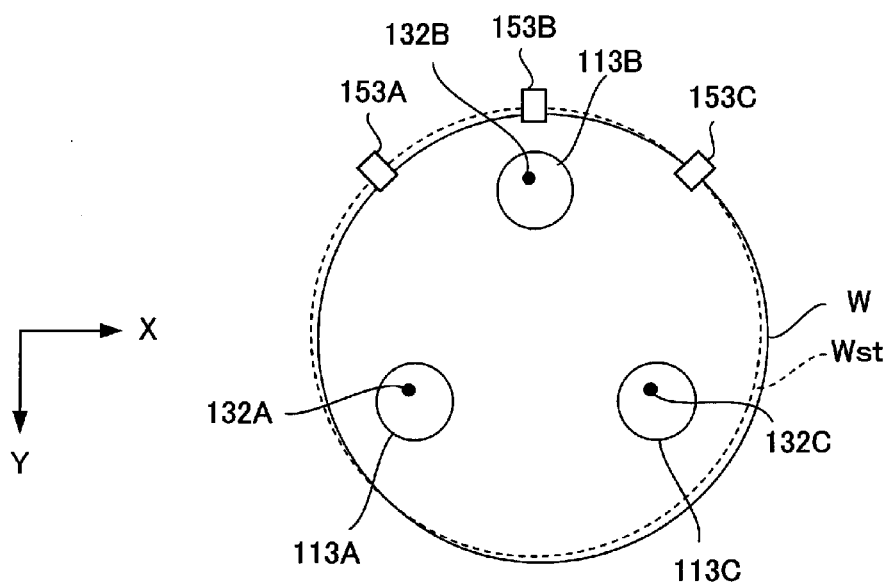
FIG. 25B presents a diagram showing a positional relationship between the supporting pins and a wafer when a positional deviation of FIG. 25A is corrected.

According to the rough correction of the position of the wafer W, the positional deviation of the wafer W is roughly corrected by calculating a temporary center of the wafer W based on only a peripheral portion shape of the wafer W detected from the measurement visual field 153C when the wafer is detected only within, for example, the measurement visual field 153C, as illustrated in FIG. 25A. Thus, as illustrated in FIG. 25B, the wafer can be moved to the position where the peripheral portion of the wafer can be detected in all of the three measurement visual fields 153A to 153C.

Referring back to step S212, if it is determined that the wafer peripheral portion cannot be detected in any of the measurement visual fields 153A to 153C of the imaging units 152A to 152C (N=0), the position adjustment of the wafer W is performed in step S240 (substrate position adjusting process).

(Adjustment of Wafer Position)

Figure 23:
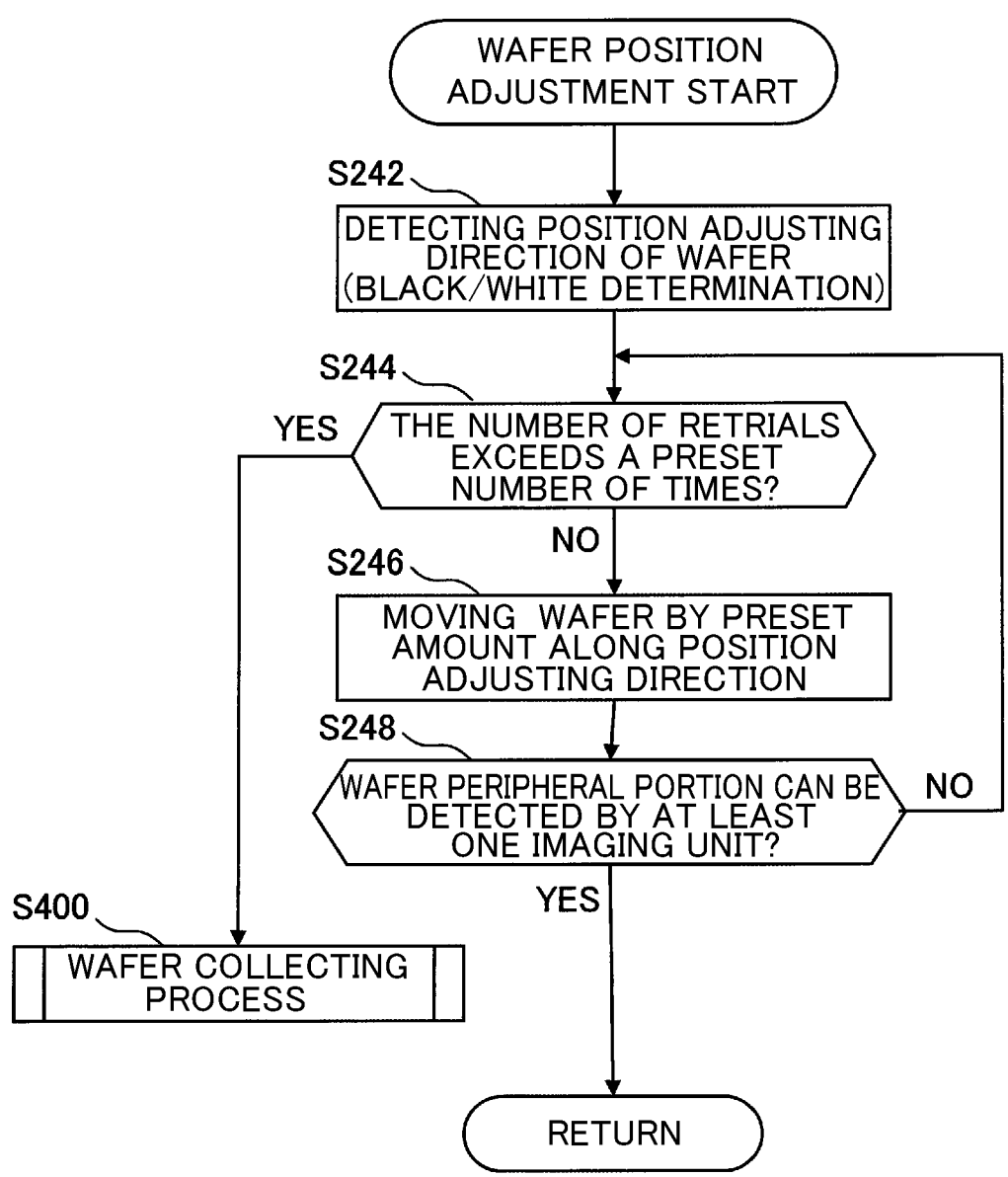
FIG. 23 is a flow chart for describing an example of wafer position adjustment shown in FIG. 20.

The aforementioned wafer position adjusting process is performed based on, for example, a flow chat illustrated in FIG. 23. Though this wafer position adjustment can be retried until the wafer peripheral portion is detected by at least one imaging unit, it may be possible to set a limit in the number of retrials. FIG. 23 shows a case in which the process can be retried as many as a preset number of times.

First, in step S242, a position adjusting direction of the wafer W is detected. Here, a combination pattern of (for example, FIGS. 7 to 12) of the black/white determination of the measurement visual fields 153A and 153C of the imaging units 152A to 152C is detected. Then, based on the substrate position adjustment data table stored in the storage unit in advance, it is determined to which one of the combination patterns P1 to P6 of the black/white determination illustrated in FIG. 6 the detected combination pattern corresponds, and a position adjusting direction corresponding to that combination pattern is acquired.

Next, in step S244, it is determined whether the number of retrials of the wafer position adjustment exceeds the preset number of times. Then, if the number of the retrials is determined to be greater than the preset number of times, the wafer collecting process is performed in step S400, whereas if the number of the retrials is found to be no greater than the preset number of times, the wafer W is gradually moved by a predetermined moving amount along the position adjusting direction by driving the supporting pins 132A to 132C in the horizontal direction in step S246. In this way, by moving the wafer W by the predetermined moving amount over a plurality of times, an excessive movement of the wafer W can be prevented, and it is possible to allow the wafer to approach the reference position Wst securely.

Further, the moving amount of the wafer W for every single wafer position adjusting operation may be stored in, for example, the substrate position adjustment data table to be matched with each combination pattern of the black/white determination, and the position adjusting direction and the moving amount of the wafer W for every single wafer position adjusting operation may be read from the substrate position adjustment data table based on the combination pattern of the black/white determination.

Subsequently, in step S248, it is determined whether the wafer peripheral portion can be detected by at least one of the imaging units 152A to 152C (that is, in which measurement visual fields 153A to 153C the wafer peripheral portion can be detected). In step S248, if the peripheral portion of the wafer cannot be detected by any of the imaging units 152A to 152C, the process goes back to step S244, and the wafer position adjustment is retried within the limit of the preset number of times for retrial.

Then, in step S248, in case that the peripheral portion of the wafer can be detected by at least one of the imaging units 152A to 152C, the series of rough correction process of the wafer position is terminated, and the process proceeds to step S212 in FIG. 20. Afterwards, the above-described process is performed depending on the number N of the imaging units 152A to 152C capable of detecting the wafer peripheral portion. That is, when N=1 or N=2, the process of step S230 is performed and when N=3, the processes of steps S214, S216 and S220 are performed. Thus, the positional deviation of the wafer can be corrected more accurately.

Figure 26A:
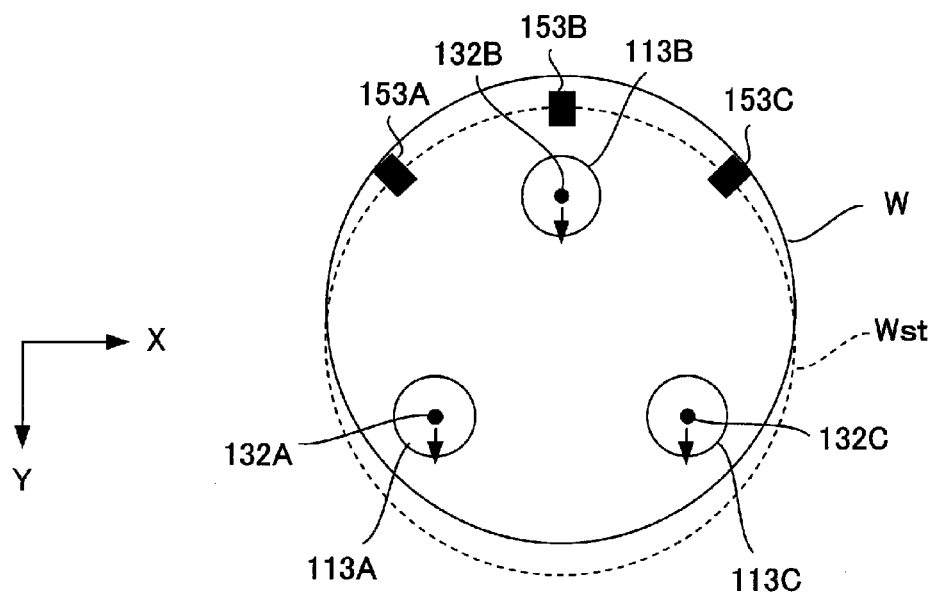
FIG. 26A is a diagram showing an example of a wafer position when a wafer peripheral portion cannot be detected in a measurement visual field of any imaging unit.
Figure 26B:
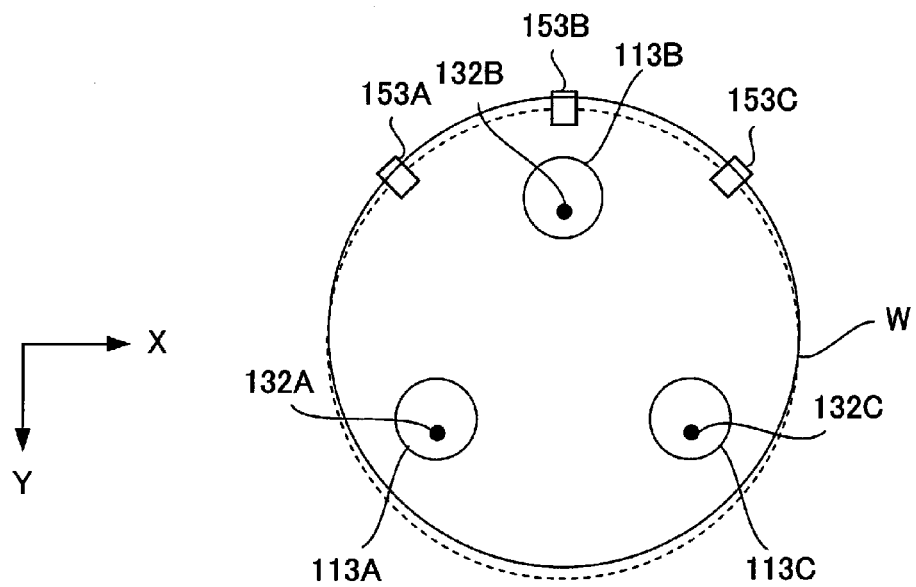
FIG. 26B is a diagram showing a positional relationship between the supporting pins and a wafer when a positional deviation of FIG. 26A is corrected.

According to such position adjustment of the wafer W, when a positional deviation of the wafer W such as illustrated in FIG. 26A occurs, the peripheral portion of the wafer is not detected in any of the measurement visual fields 153A to 153C, and black/white determinations of the measurement visual fields 153A to 153C become the combination pattern P2 meaning that they are all in black states. Therefore, the position adjusting direction becomes −180 degrees, i.e., a plus direction of the Y axis, so that the wafer is gradually moved by the supporting pins 132A to 132C by the preset amount along the position adjusting direction. Thus, as illustrated in FIG. 26B, the wafer W can be moved to a position where the peripheral portion of the wafer W can be detected in all the three measurement visual fields 153A to 153C.

According to the position adjustment of the wafer W in accordance with the present embodiment as described above, the position of the wafer W can be adjusted in the direction along which the positional deviation is roughly corrected even in case that the wafer W is so severely deviated that the wafer peripheral portion cannot be detected by any imaging unit. Therefore, the position determination of the wafer W can be carried out without inflicting any damage on the wafer W as a result of, for example, a contact of the wafer W with, e.g., a sidewall of the processing chamber or components therein.

According to the position determining process of the wafer W in accordance with the present embodiment described above, the positional deviation can be accurately corrected not only in case that the wafer peripheral portion can be detected by all the imaging units 152A to 152C, but also in case that the wafer W is so severely deviated that the wafer peripheral portion cannot be detected by any of the imaging units 152A to 152C. That is, by performing the rough correction of the wafer W when the wafer peripheral portion is detectable by a part of (here, one or two) of the imaging units, while performing the position adjustment of the wafer W when the wafer peripheral portion is undetectable by any of the imaging units 152A to 152C, it is possible to move the wafer W up to the position where the detection of its peripheral portion by all the imaging units 152A to 152C is possible.

Further, in case of roughly correcting the wafer position (for example, FIG. 22) and in case of adjusting the wafer position (for example, FIG. 23), the wafer is so severely deviated that the peripheral portion of the wafer W cannot be detected in the measurement visual fields 153A to 153C of all the imaging units 152A to 152C. Therefore, when horizontally moving the wafer W by the supporting pins 132A to 132C in step S236 shown in FIG. 22 and in step S246 shown in FIG. 23, there can be considered an occasion that a required moving amount exceeds a movable amount by which the supporting pins 132A to 132C can be moved without colliding with the walls inside the through holes 113A to 113C of the mounting table 112. In such case, it may be possible to place the wafer W on the mounting table 112 by first lowering the supporting pins 132A to 132C; and then lift up and move the wafer W again by raising the supporting pins 132A to 132C after returning their positions.

(Wafer Collecting Process)

Figure 27:
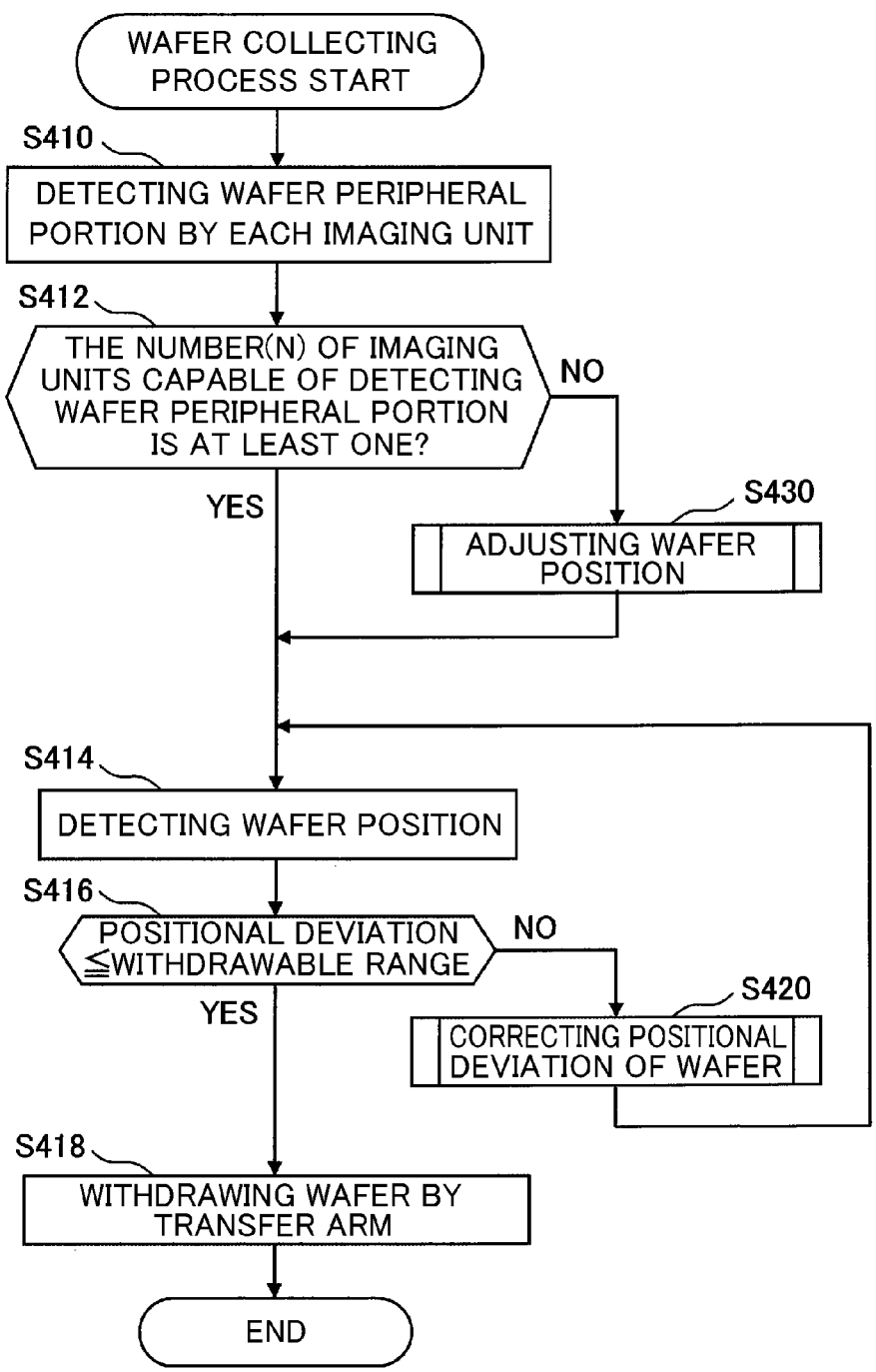
FIG. 27 is a flow chart illustrating an example of a wafer collecting process in accordance with same embodiment.

A specific example of the wafer collecting process (step S400) will be described in accordance with the present embodiment with reference to the accompanying drawings. FIG. 27 is a flow chart illustrating the specific example of the wafer collecting process. Described hereinafter is the wafer collecting process for moving the wafer W up to a position where the wafer W can be withdrawn by the transfer arm by performing a position adjustment of the wafer W through performing the above-described grey determination or black/white determination.

First, in step S410, the peripheral portion of the wafer W is detected while being lifted up by the supporting pins 132A to 132C, and a wafer peripheral portion is detected by each of the imaging units 152A to 152C (substrate peripheral portion detecting process). Here, the detection of the wafer peripheral portion is performed by grey determination of each of the measurement visual fields 153A to 153C, as in the case described in step S210 shown in FIG. 20.

Subsequently, in step S412, it is determined whether the number of the imaging units capable of detecting the wafer peripheral portion is at least one. If it is determined in step S412 that the wafer peripheral portion can be detected by at least one imaging unit, the position of the wafer W is detected based on only the output from the imaging units capable of detecting the wafer peripheral portion in step S414 (substrate position detecting process).

However, since the wafer collecting process aims at moving the wafer W into a range where it can be withdrawn by the transfer arm, the detection of the position of the wafer W need not necessarily be performed with high accuracy, in comparison with a case of performing a position adjustment of the wafer W for the purpose of loading the wafer W on the mounting table to perform a certain process thereon as illustrated in FIG. 20. Therefore, in the process of step S412, for example, when the wafer peripheral portion can be detected within the measurement visual fields of all the imaging units, for example, the center portion of the wafer is acquired from wafer peripheral portion shapes detected in all the measurement visual fields; and when the wafer peripheral portion can be detected by only one or two imaging units, the center position of the wafer (corresponding to the aforementioned rough position) is acquired only from wafer peripheral portion shapes detected in those measurement visual fields.

Thereafter, in step S416, the deviation of the wafer from the reference position Wst is detected, and then it is determined whether the deviation is within the range where the wafer is withdrawable by the transfer arm. Here, the withdrawable range is, for example, a range in which the wafer W can be safely withdrawn by the transfer arm without colliding with the wall surface of the processing chamber or components therein. For example, the range is set to, for example, about 6 mm.

Figure 28:
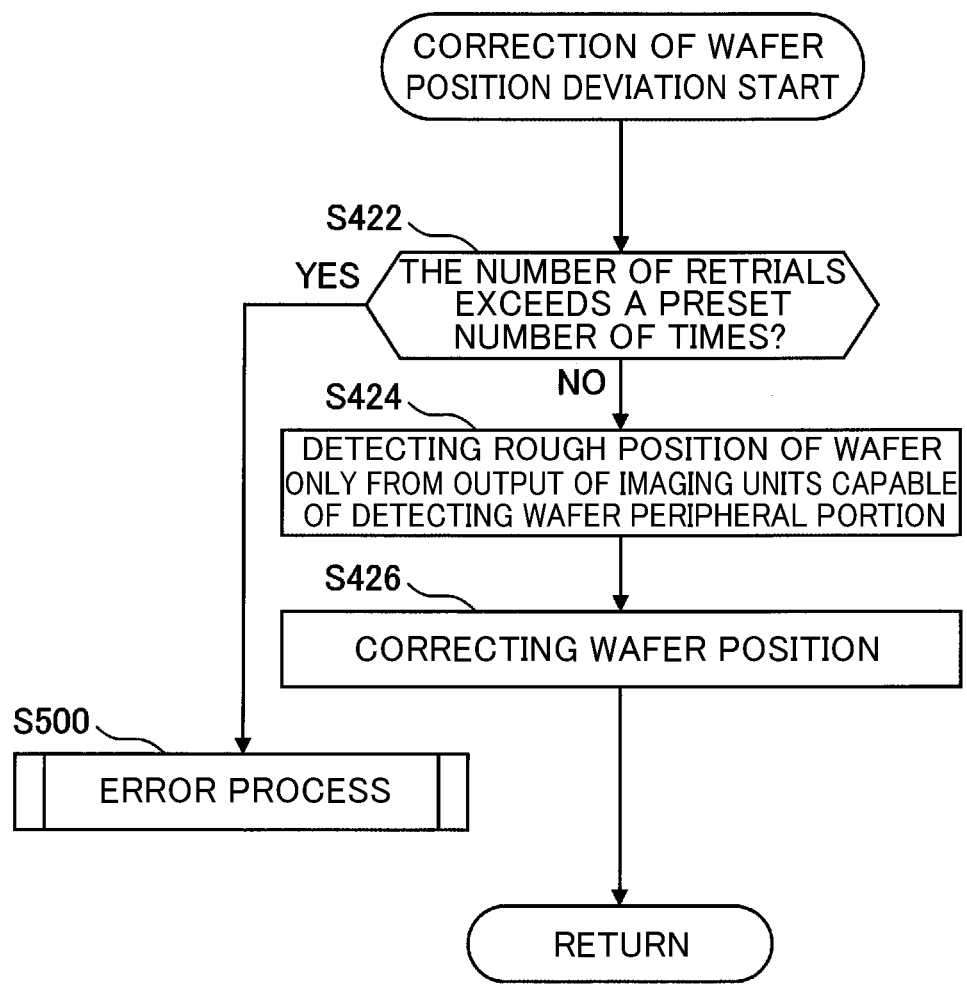
FIG. 28 is a flow chart illustrating a specific example of a wafer position deviation correction shown in FIG. 27.

Then, if it is determined in step S416 that the deviation of the wafer W exceeds the withdrawable range, the correction of the positional deviation of the wafer W is performed in step S420 (substrate position deviation correcting process). The correction of the positional deviation of the wafer W is performed based on, for example, a flow chart illustrated in FIG. 28. That is, it is determined whether the number of retrials of the correction of the positional deviation exceeds a preset number of times (for example, twice). If it is determined that the number of the retrials does not exceed the preset number of times, the positional deviation of the wafer W is corrected in step S424 by driving the supporting pins 132A to 132C in horizontal direction so that the center of the wafer w is aligned to the wafer center in the reference position Wst, and the process returns to step S414 in FIG. 27.

In this way, the correction of the positional deviation of the wafer W is repeated within the limit of the preset number of times for retrial until the positional deviation is within the withdrawable range, and if it is determined in step S416 that the positional deviation is within the withdrawable range, the wafer W is withdrawn by the transfer arm in step S418 (substrate collecting process). That is, since the wafer W is kept lifted by the supporting pins 132A to 132C, the wafer can be mounted on the transfer arm if the transfer arm is inserted between the wafer W and the mounting table 112 and the supporting pins 132A to 132C are then lowered. Then the wafer is withdrawn by retreating the transfer arm.

As described, since the positional deviation of the wafer W can be corrected if the wafer peripheral portion can be detected by at least one imaging unit, the wafer can be moved up to the position where it is withdrawable by the transfer arm. Therefore, the substrate can be withdrawn by the transfer arm without suffering damage resulted by, for example, contacting the sidewall of the processing chamber or components therein.

On the other hand, if the positional deviation is not reduced within the withdrawable range even after repeating the correction of the positional deviation and if the number of repetition is found in step S422 to exceed the preset number of times for retrials, an error process is performed in step S500. In such case, since it is highly likely that a problem such as a breakage of the wafer may occur, the withdrawal of the wafer is performed by maintenance, not by the transfer arm. For example, a notification by, for example, a buzzer goes on, and by opening the cover of the processing chamber by the maintenance, the wafer is withdrawn manually, thus protecting the transfer arm.

Figure 29:
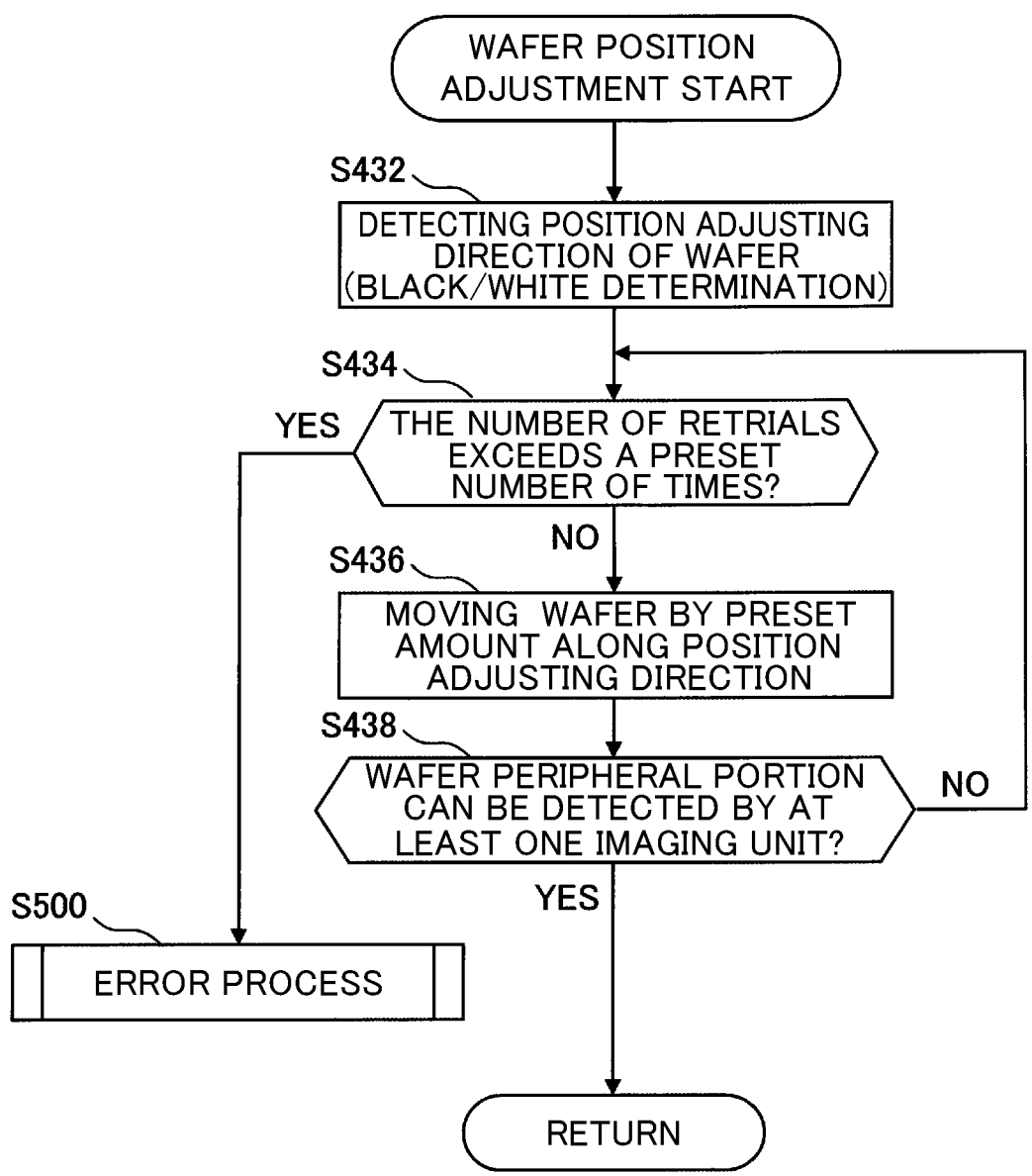
FIG. 29 is a flow chart illustrating a specific example of a wafer position adjustment shown in FIG. 27.

Further, in step S412, in case that the number (N) of the imaging units capable of detecting the wafer peripheral portion is zero, that is, in case that the wafer peripheral portion cannot be detected in the measurement visual fields of any imaging units, a position adjustment of the wafer is performed (substrate position adjusting process) in step S430. Here, the position adjustment of the wafer is performed based on, for example, a flow chart illustrated in FIG. 29. That is, a position adjusting direction is calculated by white/black determinations of the measurement visual fields 153A to 153C, and the wafer W is moved gradually by a preset amount along the position adjusting direction within the limit of the preset number of times for the retrials (steps S432 to S438) until the wafer peripheral portion can be detected by at least one imaging unit. Further, since the processes of steps S432 to S438 are identical with the processes of steps S242 to S248 illustrated in FIG. 23, detailed description thereof will be omitted.

After repeating such position adjustment of the wafer, if it is determined in step S438 that the wafer peripheral portion can be detected by at least one imaging unit, the process proceeds to the S414 illustrated in FIG. 27, and the position of the wafer W is detected based on an output of only the imaging unit capable of detecting the wafer peripheral portion. Then, if the positional deviation comes into the withdrawable range, the wafer W is withdrawn by the transfer arm in step S400 (substrate collecting process).

In contrast, if it is determined in step S434 that the number of the retrials exceeds the present number of times while the wafer peripheral portion cannot be detected by any imaging unit even after the position adjustments of the wafer W have been repeated, the error process is performed in step S500, and the withdrawal of the wafer W by the maintenance is performed as described above.

As described, according to the wafer collecting process in accordance with the present embodiment, if the wafer peripheral portion can be detected by any one of the imaging units, the correction of the wafer position is performed based on output from that imaging unit, whereas, if the wafer W is so severely deviated that the wafer peripheral portion cannot be detected by any one of the imaging units, the wafer can be moved to where it can be withdrawn by the transfer arm by means of performing the wafer position adjustment. Thus, even in case that the wafer is severely deviated to the extent that it cannot be taken out in the prior art if the withdrawing process by the maintenance is not performed, the wafer can be withdrawn by the transfer arm.

Further, in the wafer collecting process, there is a high likelihood that the wafer may be severely deviated. Therefore, when horizontally moving the wafer W by the supporting pins 132A to 132C in step S426 shown in FIG. 28 and in step S436 shown in FIG. 29, there can be considered an occasion that a required moving amount exceeds a movable amount by which the supporting pins 132A to 132C can be moved without colliding with the wall surface inside the through holes 113A to 113C of the mounting table 112. In such case, it may be possible to place the wafer W on the mounting table 112 by first lowering the supporting pins 132A to 132C; and then lift up and move the wafer W again by raising the supporting pins 132A to 132C after returning their positions.

Furthermore, the substrate transfer device in accordance with the above-described embodiment has a configuration in which the supporting pins 132A to 132C can be driven up and down so that the leading ends of the supporting pins 132A to 132C can be protruded from or receded into the through holes by the Z-directional driving unit 138Z, and the supporting pins 132A to 132C can be horizontally driven within the through holes 113A to 113C, respectively, by the X-directional driving unit 138X and the Y-directional driving unit 138Y while their leading ends are protruded from the mounting surface of the mounting table 112 through the through holes 113A to 113C, respectively. However, the present invention is not limited to such configuration.

Figure 30:
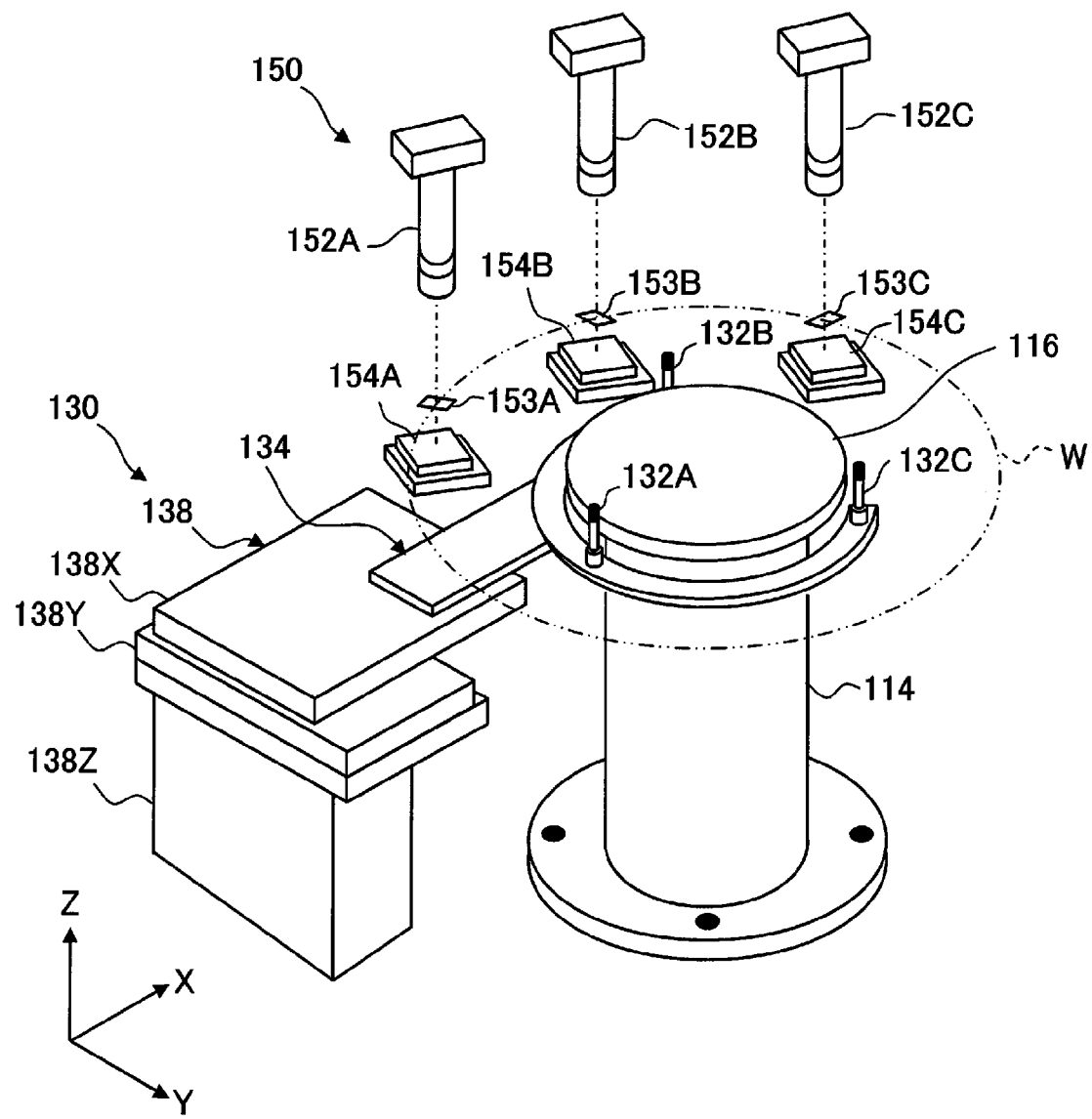
FIG. 30 is a perspective view illustrating another configuration example of the substrate transfer device in accordance with the same embodiment.

For example, as shown in a substrate transfer device 130 illustrated in FIG. 30, the supporting pins 132A to 132C may be arranged around the supporting shaft 114 of the mounting table 116 at a certain interval, outside the diameter of the mounting table 116. In this configuration, the formation of the through holes 113A to 113C for allowing the supporting pins 132A to 132C to pass therethrough becomes unnecessary. Thus, without being limited by the diameter of the thorough holes 113A to 113C, the supporting pins 132A to 132C can be sufficiently moved in horizontal direction. Therefore, when performing the correction of the positional deviation of the wafer W or performing the position adjustment thereof, a moving amount of the wafer W for a single operation can be increased.

The embodiments of the present invention have been described for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

For example, though the above embodiments have been described for the case of installing three imaging units 152A to 152C, the number of the imaging units is not limited thereto, but it can be two or more than four.

INDUSTRIAL APPLICABILITY

There present invention has advantages when it is applied to a substrate position determining method, a substrate position detecting method, and a substrate collecting method.

What is claimed is:

1. A substrate collecting method for withdrawing a substrate by a transfer arm, the method comprising:
   a substrate peripheral portion detecting step for detecting a peripheral portion of the substrate, which is a target to be withdrawn, based on output images from a plurality of imaging units disposed along a peripheral portion shape of the substrate;
   a substrate position deviation correcting step for, when the peripheral portion of the substrate can be detected by at least one imaging unit, acquiring a positional deviation from a preset reference position based on a horizontal position of the substrate obtained from a shape of the detected peripheral portion, and correcting the positional deviation by moving the substrate in a horizontal direction if the deviation exceeds a withdrawable range; and
   a substrate collecting step for withdrawing the substrate by the transfer arm when the deviation does not exceed the withdrawable range, or when the deviation is reduced not to exceed the withdrawable range through the substrate position deviation correcting step.

2. The substrate collecting method of claim 1, further comprising:
   a substrate position adjusting step for, when the peripheral portion of the substrate cannot be detected by any imaging unit, obtaining a position adjusting direction of the substrate according to a combination of presence/absence states of the substrate detected based on the output image from each imaging unit, and performing an adjustment of a substrate position by moving the substrate along the position adjusting direction.

3. The substrate collecting method of claim 2, wherein, when the peripheral portion of the substrate becomes detectable by at least one imaging unit through the substrate position adjusting step, the positional deviation from the preset reference position is acquired based on the horizontal position of the substrate obtained from the shape of the detected peripheral portion, and, if the positional deviation exceeds the withdrawable range, the positional deviation is corrected by moving the substrate along a horizontal direction; and, if the positional deviation does not exceed the withdrawable range or if the position deviation is reduced not to exceed the withdrawable range through the substrate position deviation correcting step, the substrate is withdrawn by the transfer arm.

* * * * *